(12) United States Patent
Gardner et al.

(10) Patent No.: US 11,694,957 B2
(45) Date of Patent: Jul. 4, 2023

(54) PROGRAMMABLE CONNECTION SEGMENT AND METHOD OF FORMING THE SAME

(71) Applicant: Tokyo Electron Limited, Tokyo (JP)

(72) Inventors: Mark I. Gardner, Cedar Creek, TX (US); H. Jim Fulford, Marianna, FL (US); Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 133 days.

(21) Appl. No.: 16/875,538

(22) Filed: May 15, 2020

(65) Prior Publication Data

US 2020/0365511 A1 Nov. 19, 2020

Related U.S. Application Data

(63) Continuation-in-part of application No. 16/535,174, filed on Aug. 8, 2019, and a continuation-in-part of application No. 16/535,225, filed on Aug. 8, 2019, now Pat. No. 11,069,616.

(60) Provisional application No. 62/848,657, filed on May 16, 2019, provisional application No. 62/848,289, filed on May 15, 2019.

(51) Int. Cl.
*H01L 23/525* (2006.01)
*H01L 23/528* (2006.01)

(52) U.S. Cl.
CPC ........ *H01L 23/5252* (2013.01); *H01L 23/528* (2013.01); *H01L 23/5256* (2013.01)

(58) Field of Classification Search
CPC ............. H01L 23/5252; H01L 23/5256; H01L 23/528; H01L 45/1226; H01L 45/1233; H01L 27/249; H01L 27/2481; H01L 27/2472; H10B 63/84; H10B 63/845; H10B 63/80; H10N 70/823; H10N 70/826
See application file for complete search history.

(56) References Cited

U.S. PATENT DOCUMENTS

2010/0258779 A1* 10/2010 Mikawa ............... H01L 27/2481
257/E45.001
2015/0054090 A1* 2/2015 Or-Bach ................ G11C 16/02
257/401

(Continued)

*Primary Examiner* — Latanya N Crawford Eason
(74) *Attorney, Agent, or Firm* — Oblon, McClelland, Maier & Neustadt, L.L.P.

(57) ABSTRACT

In a semiconductor device, a device structure is positioned over a substrate, where the device structure includes devices. A wiring structure of the semiconductor device is positioned over the substrate and coupled to at least one of the devices. The wiring structure includes at least one of programmable lines and programmable vertical interconnects, where the programmable lines extend along a top surface of the substrate and the programmable vertical interconnects extend along a vertical direction perpendicular to the top surface of the substrate. The programmable lines and the programmable vertical interconnects include a programmable material having a modifiable resistivity in that the programmable lines and the programmable vertical interconnects change between being conductive and being nonconductive in responsive to a current pattern delivered to the programmable lines and the programmable vertical interconnects.

18 Claims, 14 Drawing Sheets

(56) References Cited

U.S. PATENT DOCUMENTS

2018/0175110 A1* 6/2018 Hsu .................... H01L 45/1246
2020/0027925 A1* 1/2020 Eun .................... H01L 27/2463

* cited by examiner

PROGRAMMABLE CONNECTION SEGMENT AND METHOD OF FORMING THE SAME

CROSS REFERENCE TO RELATED APPLICATIONS

This application is a continuation in part of U.S. patent application Ser. No. 16/535,174 filed on Aug. 8, 2019 and U.S. patent application Ser. No. 16/535,225 filed on Aug. 8, 2019, which claims the benefit of priority to U.S. Provisional Application No. 62/848,657 filed on May 16, 2019 and U.S. Provisional Application No. 62/848,289 filed on May 15, 2019, the entire contents of which is incorporated herein by reference.

FIELD OF THE INVENTION

The disclosure relates to microelectronic devices including semiconductor devices, transistors, and integrated circuits, including methods of microfabrication.

BACKGROUND

Microelectronic devices typically have a layer or plane of devices such as transistors, which can be field effect transistors (FET). These transistors are wired together by using several wiring levels that are formed above these devices. Layers or planes in the wiring levels typically have horizontally running lines (also referred to as horizontal conducting lines, horizontal conductive lines, conductive lines). In between layers of horizontal conducting lines there are vertical interconnects (e.g., vias), which are essentially shorter lines to connect a given conductive line in one plane to a corresponding conductive line or device in another plane. A particular geometry and placement of vias and conductive lines is based on a circuit design for either logic or memory applications.

SUMMARY

In conventional circuits, making modifications to functionality of circuit elements after microfabrication has limitations. Currently in order to enable a new circuit element, a design needs to turn a transistor on or off to enable a particular data path. This means that power is needed at all times to keep (for example) an added circuit element on or off. When the added circuit element is powered up, the data to turn on or off a circuit block must be shorted in a hard code or by using non-volatile memory. If a designer wanted to connect a single path from a metal line (or a conductive line) to a different metal line (or a different conductive line), then a new photomask would be needed to make this connection. Moreover, if the designer wanted to remove a circuit then a new metal mask (photomask for a metal layer) would be needed to cut a particular metal line to create a short (or a connection). Adding new masks and custom masks to a microfabrication flow is expensive and slows throughput.

The present disclosure herein enhances 2D and 3D connections to logic circuits, memory elements, transistors and all circuit elements (with programing or programmable features) without constant modifications to photomasks. The present disclosure herein includes forming connections between horizontal conductive lines that can be turned on or off after microfabrication.

In one embodiment, horizontal conductive lines include one or more connections that are made by using a programmable material, such as a phase changeable material. The phase changeable material can be changed from conducting to non-conducting after microfabrication by using a pattern of current delivered to the phase changeable material. Accordingly any number of circuit elements can be shorted or connected after microfabrication. Accordingly, techniques herein eliminating the conventional need to make new photomasks and have complex data code stored in die to power on or off a circuit block. Being able to program horizontal connections between metal lines (or conductive lines) can be done after the die is placed in a package or in a system. This ability enables fast changes to circuit design functionality by turning on circuit blocks indefinitely or off indefinitely. Such functionality changes remain no matter a given device is powered or not powered. As can be appreciated, many benefits can be realized with such techniques. For example, power for operation can be reduced because no active circuit elements are needed to keep a new circuit block active each time a die is started and used.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a semiconductor device is provided. The semiconductor device can include a device structure positioned over a substrate, where the device structure includes devices. A wiring structure of the semiconductor device can be positioned over the substrate and coupled to at least one of the devices. The wiring structure includes at least one of programmable lines and programmable vertical interconnects, where the programmable lines extend along a top surface of the substrate and the programmable vertical interconnects extend along a vertical direction perpendicular to the top surface of the substrate. The programmable lines and the programmable vertical interconnects include a programmable material having a modifiable resistivity in that the programmable lines and the programmable vertical interconnects change between being conductive and being non-conductive in responsive to a current pattern delivered to the programmable lines and the programmable vertical interconnects.

The semiconductor device can include conductive lines extending along the top surface of the substrate, where at least one of the conductive lines are coupled to the at least one of the devices. The semiconductor device can include conductive vertical interconnects that extend along the vertical direction and are coupled to the conductive lines.

In some embodiments, a first programmable line of the programmable lines can be positioned between two first conductive lines of the conductive lines. The first programmable line and the two first conductive lines can be disposed side by side along the top surface of the substrate. In some embodiments, a second programmable line of the programmable lines can be positioned between two second conductive lines of the conductive lines, where the second programmable line and the two second conductive lines can be stacked along the vertical direction. In some embodiments, a third programmable line of the programmable lines can extend through two or more third conductive lines of the conductive lines, where the two or more third conductive lines can be stacked along the vertical direction and spaced apart from one another by a dielectric layer.

In some embodiments, a first programmable vertical interconnect of the programmable vertical interconnects can be positioned between two conductive lines of the conductive lines along the vertical direction. In some embodiments, a second programmable vertical interconnect of the programmable vertical interconnects can extend through two or more conductive lines of the conductive lines, where the two or more conductive lines can be stacked along the vertical direction and spaced apart from one another by a dielectric layer. In some embodiments, a third programmable vertical interconnect of the programmable vertical interconnects can be positioned between a contact structure of a device of the devices and a conductive line of the conductive lines along the vertical direction.

The devices in the device structure can include at least one of an active device and a passive device. For example, the devices can include a transistor, a diode, a memory device, a capacitor, and an inductor.

In some embodiments, the wiring structure can be positioned over the device structure. The wiring structure can be coupled to the device structure through at least one of a programmable vertical interconnect of the programmable vertical interconnects and a programmable line of the programmable lines.

In some embodiments, the wiring structure can be positioned under the device structure, where the wiring structure can be coupled to the device structure through at least one of a programmable vertical interconnect of the programmable vertical interconnect and a programmable line of the programmable lines.

In some embodiments, the wiring structure and the device structure can be positioned side by side over the substrate, where the wiring structure can be coupled to the device structure through at least one programmable line of the programmable lines.

In some embodiments, the wiring structure can include a first wiring structure and a second wiring structure. The first wiring structure, the device structure and the second wiring structure can be stacked sequential over the substrate. The first wiring structure, the device structure and the second wiring structure can be coupled to each other through one or more programmable vertical interconnects of the programmable vertical interconnects and one or more programmable lines of the programmable lines.

In the semiconductor device, the programmable material can be a phase-changeable material that changes between being conductive and being non-conductive responsive to the current pattern.

According to another aspect of the disclosure, a semiconductor device is provided. The semiconductor device includes a device structure positioned over a substrate, where the device structure includes devices. The semiconductor device also includes a wiring structure positioned over the substrate and coupled to at least one of the devices.

The wiring structure includes conductive line extending along a top surface of the substrate, programmable lines extending along the top surface of the substrate, conductive vertical interconnects extending along a vertical direction perpendicular to the top surface of the substrate, and programmable vertical interconnects extending along the vertical direction. The programmable lines and the programmable vertical interconnects include a programmable material having a modifiable resistivity in that the programmable lines and the programmable vertical interconnects change between being conductive and being non-conductive in response to a current pattern delivered to the programmable lines and the programmable vertical interconnects.

In some embodiments, a first programmable line of the programmable lines can be positioned between two first conductive lines of the conductive lines, where the first programmable line and the two first conductive lines can be disposed along the top surface of the substrate. A second programmable line of the programmable lines can be positioned between two second conductive lines of the conductive lines, where the second programmable line and the two second conductive lines can be stacked along the vertical direction. A third programmable line of the programmable lines can extend through two or more third conductive lines of the conductive lines, where the two or more third conductive lines can be stacked along the vertical direction and spaced apart from one another by a dielectric layer.

In some embodiments, a first programmable vertical interconnect of the programmable vertical interconnects can be positioned between two conductive lines of the conductive lines along the vertical direction. In some embodiments, a second programmable vertical interconnect of the programmable vertical interconnects can extend through two or more conductive lines of the conductive lines, where the two or more conductive lines can be stacked along the vertical direction and spaced apart from one another by a dielectric layer. In some embodiments, a third programmable vertical interconnect of the programmable vertical interconnects can be positioned between a contact structure of a device of the devices and a conductive line of the conductive lines along the vertical direction.

The devices in the device structure can include at least one of an active device and a passive device. For example, the devices can include a transistor, a diode, a memory device, a capacitor, and an inductor.

In some embodiments, the wiring structure can be positioned over the device structure. The wiring structure can be coupled to the device structure through at least one of a programmable vertical interconnect of the programmable vertical interconnects and a programmable line of the programmable lines.

In some embodiments, the wiring structure can be positioned under the device structure, where the wiring structure can be coupled to the device structure through at least one of a programmable vertical interconnect of the programmable vertical interconnect and a programmable line of the programmable lines.

In some embodiments, the wiring structure and the device structure can be positioned side by side over the substrate, where the wiring structure can be coupled to the device structure through at least one programmable line of the programmable lines.

In some embodiments, the wiring structure can include a first wiring structure and a second wiring structure. The first wiring structure, the device structure and the second wiring structure can be stacked sequential over the substrate. The first wiring structure, the device structure and the second wiring structure can be coupled to each other through one or more programmable vertical interconnects of the programmable vertical interconnects and one or more programmable lines of the programmable lines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
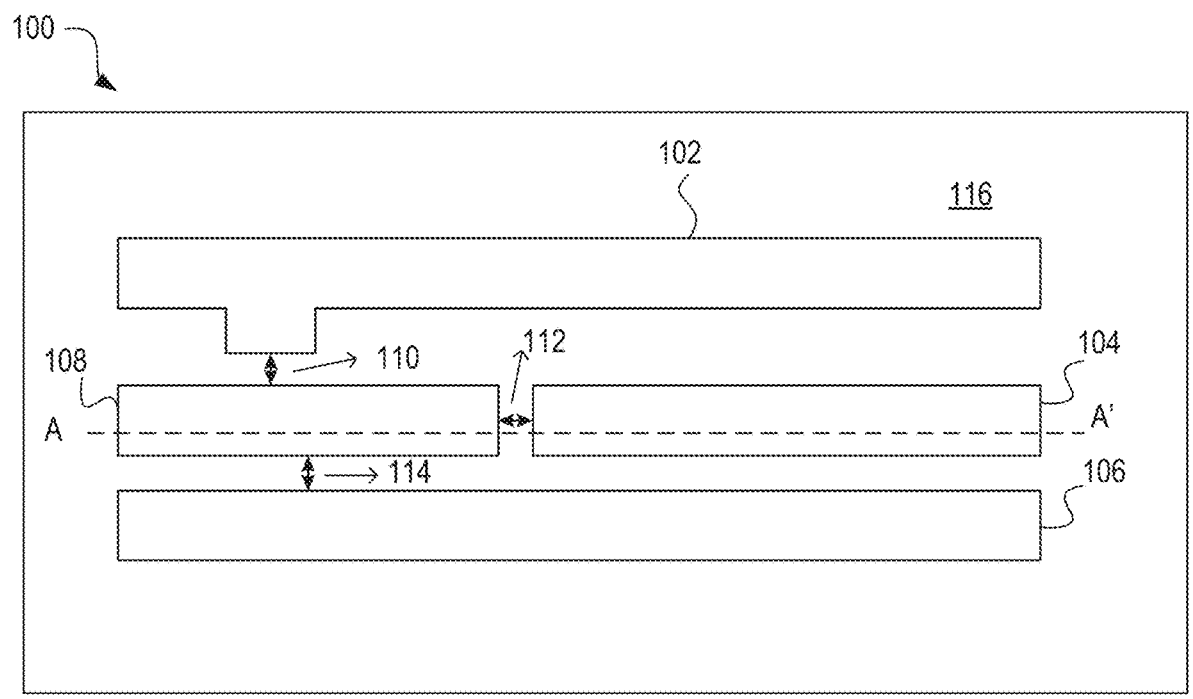
FIG. 1 is a top down view of an exemplary substrate segment including conductive lines, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Techniques herein include forming programmable connections (also referred to programmable bridges, programmable horizontal bridges) between horizontal conductive lines or wires that can be turned on or off after microfabrication. The horizontal conductive lines typically extend in a plane that is a parallel to a layer or plane of transistor devices of a circuit. For example, microelectronic circuits typically include multiple levels or planes of conductive lines that are interconnected and that include vertical interconnects (e.g., vias) to connect conductive lines in a given plane to conductive lines in another plane. These vias are vertical in that they typically extend perpendicular to planes of conductive lines (or metal layers) as well as a level of transistor devices. In one embodiment, the programmable connections include one or more connections made using a programmable material, such as a phase-changeable material. The phase-changeable material can be changed from conducting material to non-conducting material after microfabrication by using a pattern of current delivered to the programmable connections (phase-changeable material). Accordingly, any number of circuit elements can be shorted or electrically connected after microfabrication.

As such, techniques herein eliminate the conventional need to make new photomasks and have complex data code stored in die to power on or off a circuit block. Being able to program horizontal interconnects between metal lines (or conductive lines) can be done after a corresponding die is placed in a package or in a system. This ability enables fast changes to circuit design functionality by turning on circuit blocks indefinitely or turning off circuit blocks indefinitely. Such functionality changes remain whether a given device is powered or not powered. As can be appreciated, many benefits can be realized with such techniques. For example, a power for operation can be reduced because no active circuit elements are needed to keep a new circuit block active each time when a die is started and used.

Methods of forming horizontal programmable conducting bridges (also referred to as programmable horizontal bridges) between conductive lines can be integrated into conventional metallization process flows. For example, in one process flow, a metal layer (or wiring level) is created.

This metal layer can be created by a way of a single damascene or dual damascene. Metal (or a conductive material) can be deposited, masked, and etched. Conductive liners can be optionally added. A phase-changeable material can be deposited in all trenches and then selectively masked to cover a portion of the phase-changeable material that needs to be kept, while an uncovered portion of the phase-changeable material is removed. Then the conductive material can be deposited in uncovered trenches. Alternatively, metal lines (or conductive lines) are formed first, and then phase-changeable material is deposited in trenches or openings that are created or are selectively masked or filled with a replaceable/sacrificial material.

The phase-changeable material is a material that can change its physical properties to be either conductive or non-conductive (resistive or insulating). Example materials include InSe, SbSe, SbTe, InSbSe, InSbTe, GeSbSe, GeSbTeSe and AgIn InSe, SbSe, SbTe, InSbSe, InSbTe, GeSbSe, GeSbTeSe, AgIn, Ag2Se, Ge2Se3, GeSb, Ge2Sb2, GeSbTeN, and Ge2Sb2Te5. These materials are phase-changeable in that a molecular structure can be changed between being amorphous and crystalline in response to a particular current pattern delivered to these materials. A liner material can optionally be used to hold or help contain the phase-changeable materials. Example liner materials include TiN, TaN, Ta, TiW, Ti, Ru, Au, W, Cu, Pt, CoSi2, NiSi2, TiSi2, Mo, Al, CuAl, and CuMn.

FIG. 1 is a top down view of an example substrate segment 100 that includes a plurality of conductive lines 102-108. The conductive lines can be positioned over a substrate 101 (referring to FIG. 3) and can be made of tungsten, copper, ruthenium, cobalt, aluminum, or other suitable conductive materials. Note that there are also gaps between conductive lines. For example, three gaps 110-114 are included in FIG. 1. These gaps can be line segments or trench segments that are designed to have no conductive material deposited in those locations (by masking and/or using dummy/sacrificial material). A dielectric layer 116 can be formed to separate the conductive lines from one another. The dielectric layer 116 can be a SiO, SiN, or other suitable dielectric materials.

Figure 2:
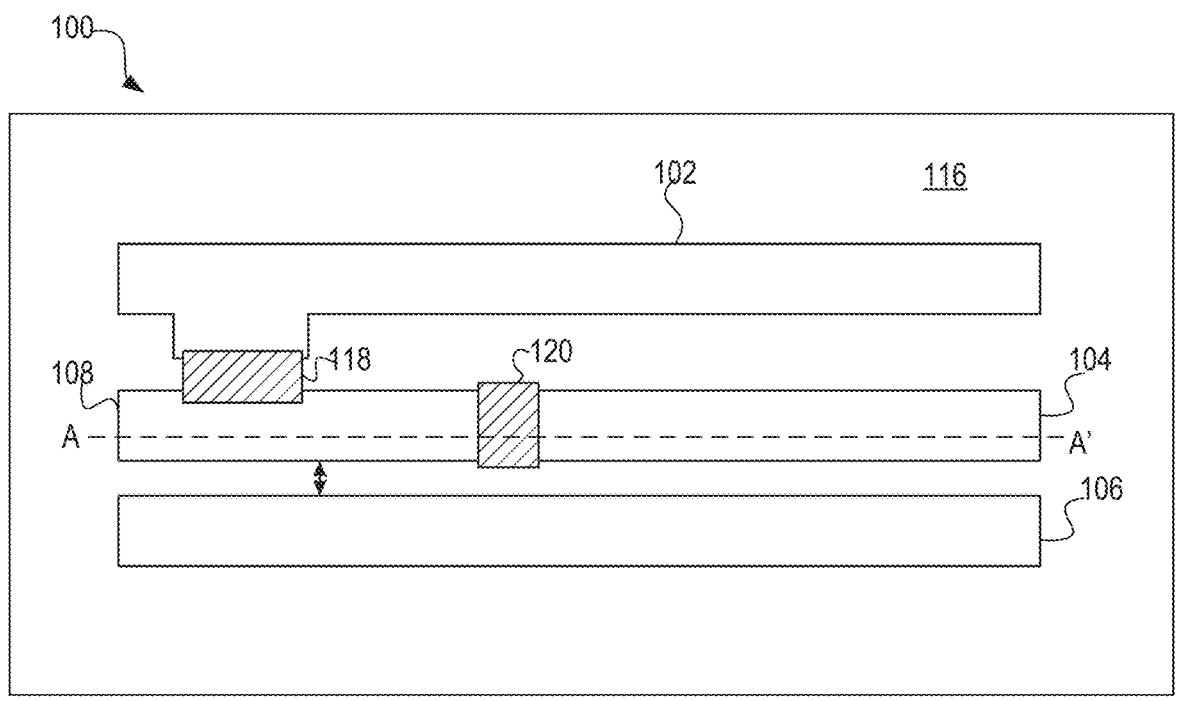
FIG. 2 is a top down view of an exemplary substrate segment including conductive lines and programmable horizontal bridges, in accordance with some embodiments

FIG. 2 is a top down view of the substrate segment 100 after a programmable material is added so that one or more programmable horizontal bridges are formed. As shown in FIG. 2, two programmable horizontal bridges 118 and 120 are formed at locations of the gaps 110 and 112. The programmable horizontal bridge 118 connects the conductive lines 108 and 110, and the programmable horizontal bridge 120 connects the conductive lines 104 and 108. In order to form the programmable horizontal bridges 118 and 120, the gaps (line segments or trench segments) 110-112 can be formed through a photomask (not shown) and an etching process. The photomask can further be used to function as a keep mask that limits deposition of the programmable material to specific areas (e.g., gaps 110-112) to create programmable horizontal bridges 118-120 that physically connect or bridge two conductive lines respectively. Note that a programmable horizontal bridge (e.g., 118) can be positioned between two parallel lines, or a programmable horizontal bridge (e.g., 120) can extend along a single line path.

Figure 3:
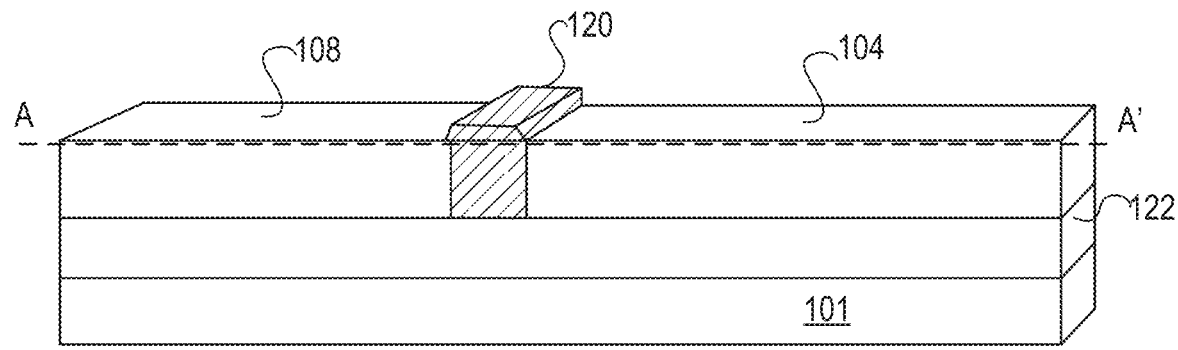
FIG. 3 is a side cross-sectional view of an exemplary substrate segment including programmable horizontal bridges, in accordance with some embodiments.

FIG. 3 is a side cross-sectional view of the substrate segment 100, which is obtained from a line A-A' along a direction perpendicular to a top surface of the substrate segment 100 in FIG. 2. As shown in FIG. 3, the substrate segment 100 can include a substrate 101. The substrate 101 may include a silicon (Si) substrate, a germanium (Ge) substrate, a silicon germanium (SiGe) substrate, and/or a silicon-on-insulator (SOI) substrate. Over the substrate 101, an insulation layer 122 can be formed. The insulation layer 122 can be made of SiO, SiN, or other suitable dielectric materials. The conductive lines 104 and 108, and the programmable horizontal bridge 120 are formed over the insulation layer 122, where the programmable horizontal bridge 120 connects the conductive lines 104 and 108.

Figure 4:
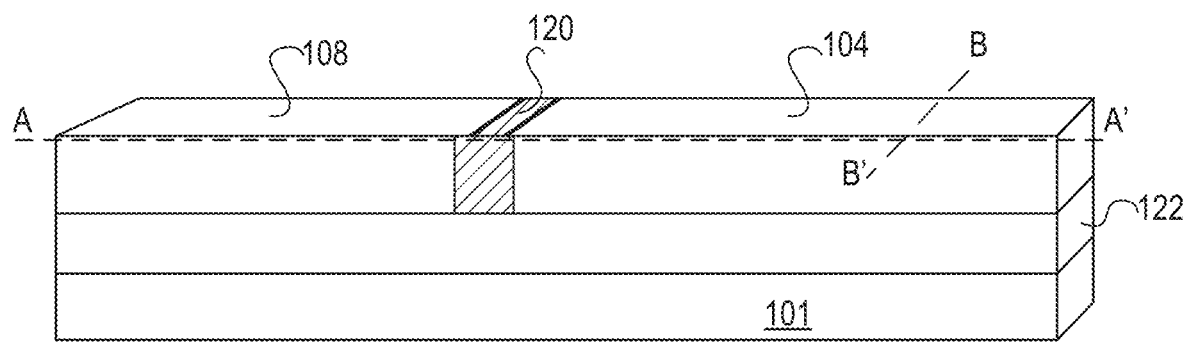
FIG. 4 is another side cross-sectional view of an exemplary substrate segment including programmable horizontal bridges, in accordance with some embodiments.

In some embodiments, a given metal layer (or wiring level) is formed with openings (or gaps, line segments, trench segments) for depositing phase-changeable material to fill the trench segments, and then a blanket etch back or chemical-mechanical planarization (CMP) is executed to remove any overburden of the phase-changeable material over the conductive lines. FIG. 4 illustrates a side cross-sectional view of substrate segment 100, where the programmable horizontal bridge 120 is planarized so that a top surface the programmable horizontal bridge 120 is level with top surface of the conductive lines 104 and 108. Upon completion of the surface planarization process, a wiring level, such as a first wiring level, is formed that is arranged over the insulation layer 122, and includes the conductive lines 104 and 108, and the programmable horizontal bridge 120.

Figure 5:
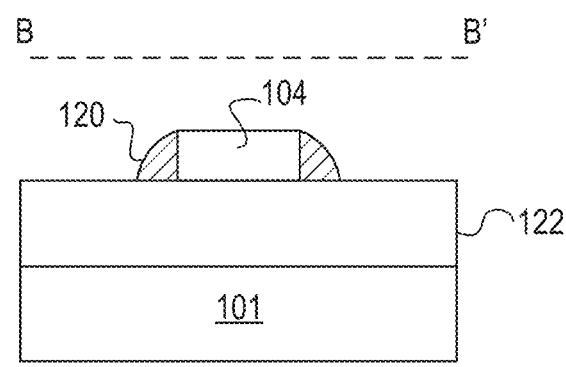
FIG. 5 is a cross-sectional view of an exemplary substrate segment including programmable horizontal bridges, in accordance with some embodiments.

Note that if the conductive lines have exposed sidewalls, the phase-changeable material can be deposited on sidewalls or remained on sidewalls after an initial blanked etch to remove an overburden that is mentioned in FIG. 4. FIG. 5 illustrates a cross-sectional view of the phase-changeable material that remains on sidewalls of the conductive line 104 after the blanket etch back or CMP to remove any overburden of the phase-changeable material over the conductive lines 104 and 108. FIG. 5 is obtained from a line B-B' along a direction perpendicular to the conductive line 104 in FIG. 4.

Figure 6:
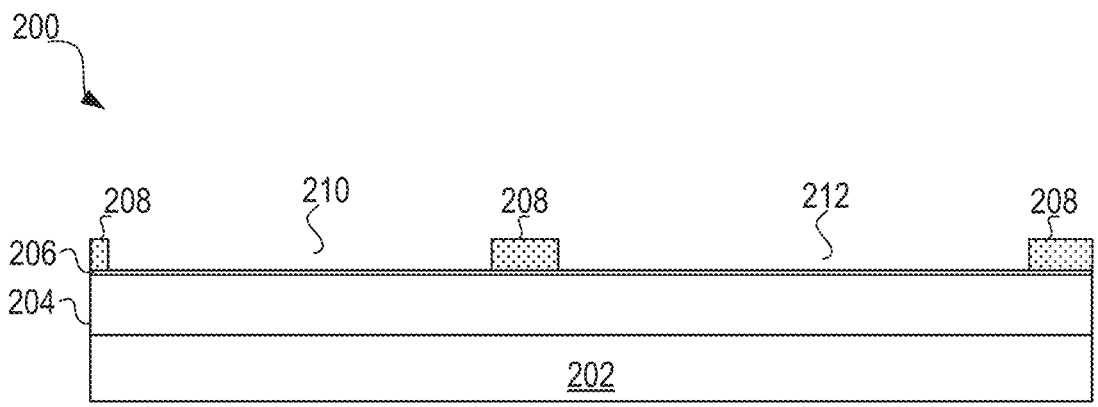
FIGS. 6-10 are cross-sectional views of various intermediate steps of manufacturing a semiconductor device including programmable horizontal interconnects, in accordance with some embodiments.

FIGS. 6-9 illustrate an exemplary single damascene flow to form a programmable horizontal interconnect. As shown in FIG. 6, a substrate segment 200 is provided. The substrate segment 200 has a substrate 202, an insulation layer 204 that is formed over the substrate 202, an etch stop layer 206 that is formed over the insulation layer 204, and a dielectric layer 208 that is formed over the etch stop layer 206. Further, a relief pattern can be formed in the dielectric layer 208 through any suitable manufacturing process, such as a combination of a photolithography process and an etching process. The relief pattern can include a plurality of trenches. For example, two trenches 210 and 212 are included in FIG. 6. In some embodiments, the etch stop layer 206 can includes SiN, SiC, SiCN, AlO, and other suitable materials. The dielectric layer 208 can be made of SiO, or a low K material.

Figure 7:
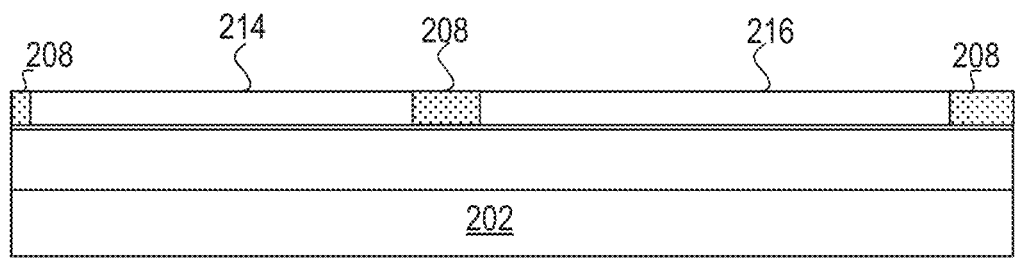

In FIG. 7, the trenches 210 and 212 can then be seeded and filled with a conductive material, such as tungsten, copper, ruthenium, cobalt, by using a suitable deposition process. The deposition process can include a chemical vapor deposition (CVD), a physical vapor deposition, an atomic layer deposition, a diffusion, a sputtering, or other suitable deposition processes. An overburden of the conductive materials (e.g., metal) can be removed by a CMP process from a top surface of the dielectric layer 208. After the CMP process, a plurality of conductive lines can be formed and the conductive lines are spaced apart from each other by the dielectric layer 208. For example, two conductive lines 214 and 216 are included in FIG. 7.

Figure 8:
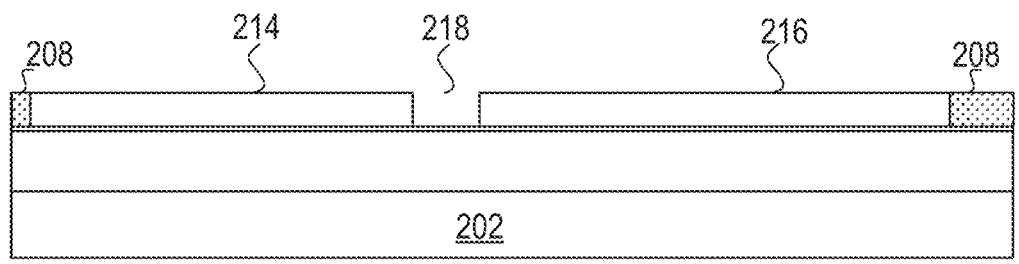

Further, a photoresist mask (not shown) can be used to remove the dielectric layer between conductive lines at selected locations. FIG. 8 illustrates that the dielectric layer 208 positioned between the conductive lines 214 and 216 is removed. In order to remove the dielectric layer 208 between the conductive lines 214 and 216, the photoresist mask can be applied to cover the conductive lines 214 and 216, and leave the dielectric layer 208 between the conductive lines 214 and 216 uncovered. A subsequent etching process can be applied to remove the dielectric layer 208 between the conductive lines 214 and 216. The photoresist mask is then removed by an ashing process and a gap (or a line segment, a trench segment) 218 is formed between the conductive lines 214 and 216.

Figure 9:
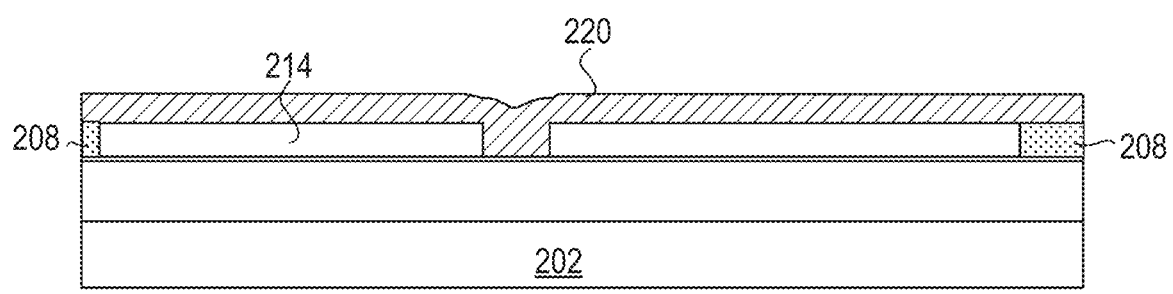

In FIG. 9, a conductive liner (not shown) can optionally be added to fill in the gap 218, and then a phase-changeable material 220 is deposited over the conductive liner to fill the gap 218 fully. The phase-changeable material 220 further covers top surfaces of the conductive lines 214 and 216. The conductive liner can include TiN, TaN, Ta, TiW, Ti, Ru, Au, W, Cu, Pt, CoSi2, NiSi2, TiSi2, Mo, Al, CuAl, CuMn, or other suitable materials. The phase-changeable material 220 that is deposited in FIG. 9 can include InSe, SbSe, SbTe, InSbSe, InSbTe, GeSbSe, GeSbTeSe and AgIn InSe, SbSe, SbTe, InSbSe, InSbTe, GeSbSe, GeSbTeSe, AgIn, Ag2Se, Ge2Se3, GeSb, Ge2Sb2, GeSbTeN, and Ge2Sb2Te5. The phase-changeable material 220 can be deposited in either a crystalline state or amorphous state. Many suitable processes can be applied to form the phase-changeable material, such as CVD (chemical vapor deposition), PVD (physical vapor deposition), diffusion, sputter, and atomic layer deposition (ALD). For example, Ge2Sb2Te5 can be prepared by thermal evaporation of single-element sources at a base pressure of $1\times10-8$ mbar.

Figure 10:
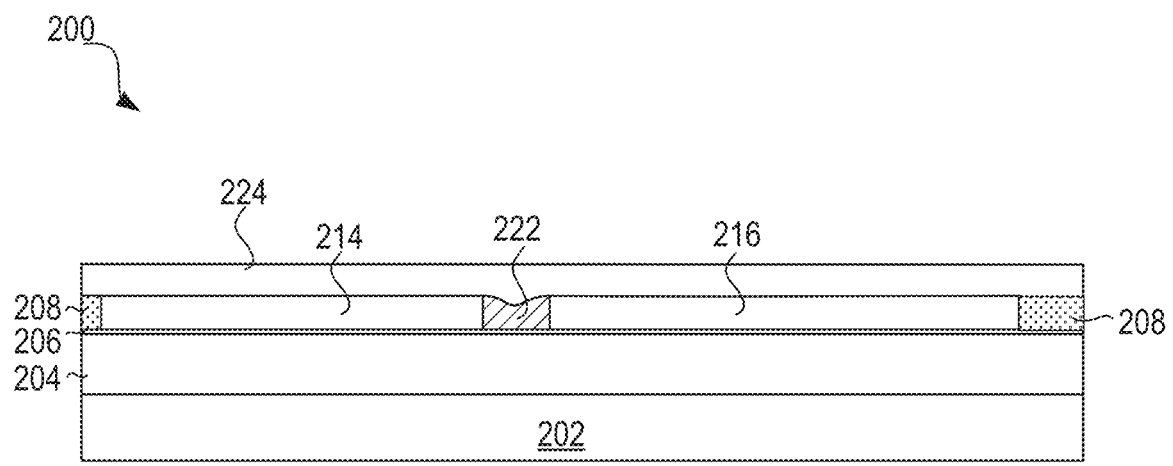

As shown in FIG. 10, the substrate segment 200 can then be processed with an etch back or CMP process to remove any overburden of the phase-changeable material 220 that covers top surfaces of the conductive lines 214 and 216. The phase-changeable material 220 remains in the gap 218 becomes a programmable horizontal bridge 222. In some embodiments, a capping layer (not shown) can optionally be added over the programmable horizontal bridge 222. Further an insulation layer 224 can then be deposited over the programmable horizontal bridge 222, and the conductive lines 214-216. When the insulation layer 224 is formed, conventional microfabrication processes can then be continued to complete a corresponding chip.

Figure 11:
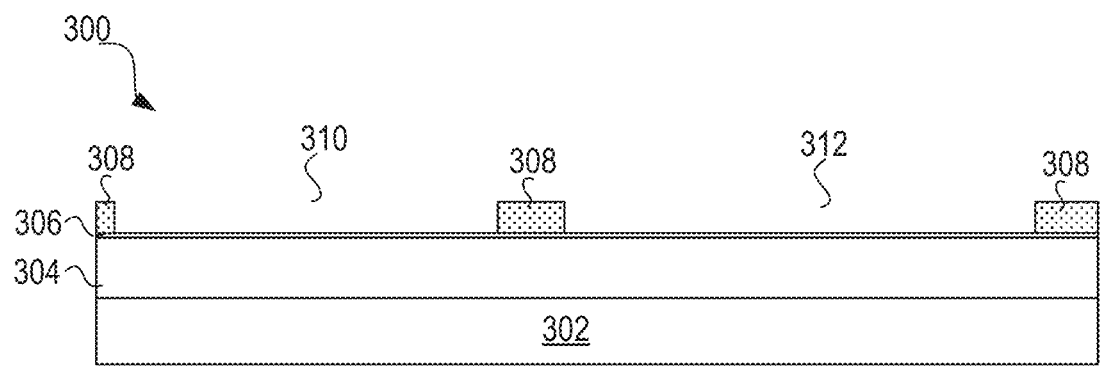
FIGS. 11-15 are cross-sectional and top down views of various intermediate steps of manufacturing another semiconductor device including programmable horizontal interconnects, in accordance with some embodiments.

FIGS. 11-15 illustrate another exemplary flow to form the programmable horizontal bridge. As shown in FIG. 11, a substrate segment 300 is provided. The substrate segment 300 has a substrate 302, an insulation layer 304 formed over the substrate 302, an etch stop layer 306 formed over the insulation layer 304, and a dielectric layer 308 formed over the etch stop layer 306. Further, a relief pattern can be formed in the dielectric layer 308 through any suitable manufacturing process, such as a combination of a photolithography process and an etching process. The relief pattern can include a plurality of trenches. For example, two trenches 310 and 312 are included in FIG. 11. In some embodiments, the etch stop layer 306 can includes SiN, SiC, SiCN, AO, and other suitable materials. The dielectric layer 308 can be made of SiO, or a low K material.

Figure 12:
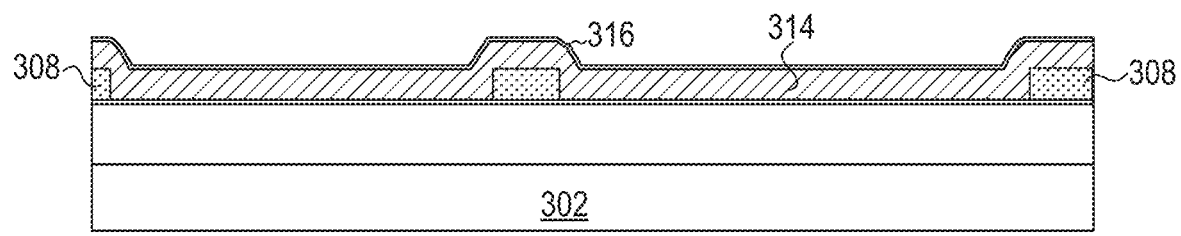

In FIG. 12, a phase-changeable material 314 can be deposited to fill in the trenches 310 and 312. The phase-changeable material 314 can further cover the dielectric layer 308. In some embodiments, a capping layer 316 can be optionally deposited over the phase-changeable material 314. The capping layer can include SiN, SiC, a high-K material, a low-K material, a metal oxide, an ALD metal oxide, or the like. Any suitable process can be applied to form the capping layer, such as a CVD process, a PVD process, a diffusion process, and an ALD process.

Figure 13:
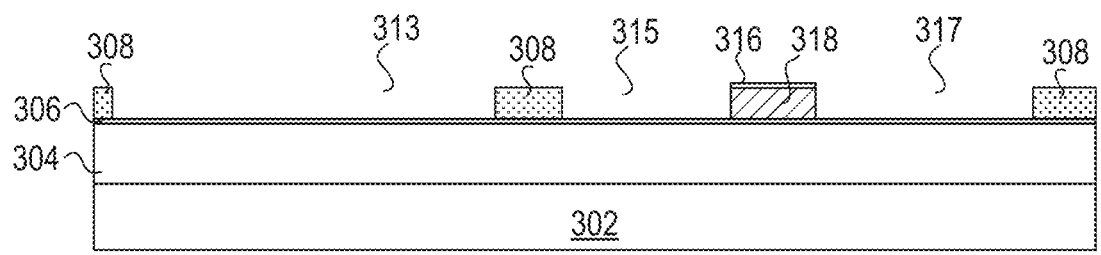

Next, any overburden of the phase-changeable material 314 can be optionally removed. By using a photolithography process, an etch mask can be formed to selectively cover portions of the phase-changeable material that needs to be kept. Then the phase-changeable material 314 can be etched to remove all uncovered portions, and the etch mask and corresponding materials (e.g., etching residuals) can be removed from the substrate segment 300, which leaves a programmable horizontal bridge 318, and a plurality of line segments (or trench segments) 313, 315, 317 that are illustrated in FIG. 13.

Figure 14:
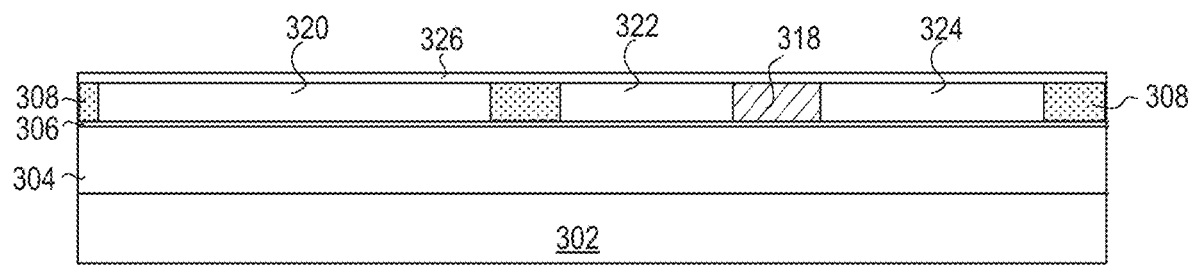

In FIG. 14, the manufacturing process can continue with a metal deposition as a part of a damascene flow. The metal can be deposited to fill in the line segments 313, 315, and 317. The metal can further cover the dielectric layer 308 and the programmable horizontal bridge 318. A surface planarization process (e.g., CMP) can subsequently be applied to remove any overburden of the metal from top surfaces of the dielectric layer 308. The surface planarization process can further remove the capping layer 316 that is formed on the programmable horizontal bridge 318. The metal that remains in the line segments 313, 315, and 317 become a plurality of conductive lines 320, 322, and 324 respectively. In some embodiments, a capping layer 326 can be subsequently formed over the conductive lines and the programmable horizontal bridge 318. Similar to the capping layer 316, the capping layer 326 can be SiN, SiC, a high-K material, a low-K material, a metal oxide, an ALD metal oxide, or the like.

Figure 15:
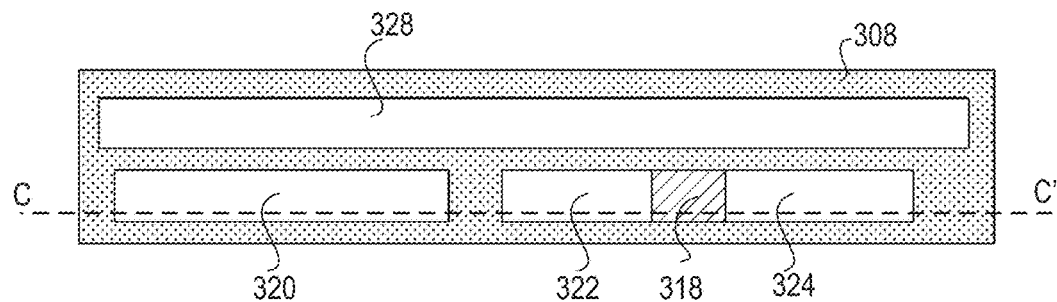

FIG. 15 is a top down view of the substrate segment 300 when the conductive lines are formed. It should be noted that the cross-sectional view of the substrate segment 300 in FIG. 14 is obtained from a line C-C' along a direction perpendicular to the conductive lines 320, 322, and 324 in FIG. 15. For simplicity and clarity, the capping layer 326 is not shown in FIG. 15.

As can be appreciated, several embodiments are contemplated herein, including a programmable horizontal bridge (also referred to programmable line segment), methods of making, and methods of using. One embodiment is a microelectronic device comprising a first level having a plurality of transistor devices or other semiconductor devices such as capacitors. Multiple wiring levels are formed in different planes relative to the first level. A first wiring level of the multiple wiring levels can be positioned over the first level, and a second wiring level of the multiple wiring levels can be positioned over the first wiring level. The multiple wiring levels include lines of conductive material (or conductive lines) extending parallel to the first level. The wiring levels include vertical interconnects (e.g., vias) that connect given wiring levels to each other. The wiring levels can be formed above and/or below a plane of transistor devices.

A programmable line segment is formed as a segment of a particular line of a given wiring level. The programmable line segment comprises a programmable material having a modifiable resistivity in that the programmable line segment can change between being conductive and non-conductive. When the programmable line segment is programmed, the programmable material itself that forms the programmable line segment can be changed, switched, or "programmed" to function as a conductor or as a non-conductor (resistor), or as a partial conductor. Note that non-conductor herein means that the programmable line segment is resistive to conducting electrical signals of the corresponding microelectronic device relative to a conductive state in which the programmable line segment conducts electricity between two conductive lines or structures. Accordingly, the programmable line segment is a resistivity changeable bridge between two conductors or conductive entities.

The programmable line segment can change between being conductive and non-conductive according to a current pattern delivered to the programmable line segment. The programmable line segment can be formed based on a phase-changeable material. Delivering a first current pattern to the programmable line segment causes the phase-changeable material to become amorphous, while delivering a second current pattern to the programmable line segment causes the phase-changeable material to become crystalline. For example, a given pulse pattern can have short pulse or long pulses and accordingly affect the molecular structure.

The programmable line segment can fill an entire cross-sectional segment of a corresponding line. In other words, metal or conductive material of a line or conductive entity does not form a part of the line segment, such as around an outside portion of the segment, that would enable a signal transmission. Instead, either an entire line segment is removed and replaced with the programmable material, or the programmable material fills a gap between two conductive lines or extends along a conductive line, where the programmable line segment can connect two conductive lines that are less than 500 microns in diameter, or less than 500 nanometers in cross-sectional width.

The programmable line segment can be formed within a given metal layer (or wiring level), or can be formed on two or more metal layers. The programmable line segment can connect two parallel conductive lines that are positioned in a same wiring level, or can replace a segment of a particular conductive line. The programmable line segment can include a second phase-changeable material that is different from the first phase-changeable material in that a resistivity shift is triggered by different current patterns. The first programmable line segment is formed of a first material that changes resistivity in response to a first current pattern, and a second programmable line segment is formed of a second material that changes resistivity in response to a second current pattern. In other words, for example, a bi-layer programmable horizontal bridge is formed. If either of the first and second phase-changeable materials is programmed to be a conductor, then signals can be transmitted across the bi-layer programmable horizontal bridge.

The programmable line segment is positioned at a location to toggle a predetermined function of a corresponding integrated circuit. For example the function can be an individual transistor, standard cell, collection of transistors, redundant circuit, memory array, or larger function on an integrated circuit. As can be appreciated, any number of chip functions can be toggled accordingly.

Another embodiment includes a method of forming a microelectronic device. The method includes forming conductive lines as part of a wiring level of a semiconductor device. Forming a programmable horizontal bridge that physically connects a first conductive line to a second conductive line in the wiring level. The programmable horizontal bridge can be formed by using a first material that can phase change between a conductor and an insulator.

The first material can be deposited in a crystalline state or in an amorphous state. This is beneficial because (depending on a particular phase-changeable material) depositing in a crystalline state can be used for filling smaller spaces, while depositing material as amorphous can be more efficient.

Forming the programmable horizontal bridge includes forming a relief pattern, such as a damascene pattern, in a dielectric material, where the relief pattern includes a plurality of trenches. The first material is deposited to fill the trenches of the relief pattern. Selected portions of the first material are masked (or covered) by using a first mask. Uncovered portions of the first material are removed from the substrate segment. The first mask is removed, and then the trenches are filled with a conductive material.

Forming the programmable horizontal bridge can include depositing a conductive material in trenches to form conductive lines, as well as depositing the first material in a trench segment (or line segment, gap) to physically connect two conductive lines. Depositing the first material in the trench segment can include removing a sacrificial material (e.g., a dielectric material) that fills the trench segment and replacing the sacrificial material with the first material.

Embodiments can include a method of using a microelectronic device. Methods can include accessing a microelectronic device that has an array of transistor devices and a wiring structure including multiple wiring levels having lines of conductive material and vertical interconnects of conductive material that connect given lines of conductive material together. The wiring structure includes at least one programmable horizontal bridge that connects two conductive lines. The programmable horizontal bridge includes a first material having a modifiable resistivity in that the programmable horizontal bridge can change between being conductive and being non-conductive. A specific circuit function to deactivate corresponding to the programmable horizontal bridge is identified. Then a first current pattern is transmitted to the programmable horizontal bridge that causes the programmable horizontal bridge to change from being conductive to being non-conductive, such that the specific circuit function is deactivated. Alternatively, a specific circuit function is identified to activate corresponding to the programmable horizontal bridge. Then a second current pattern is transmitted to the programmable horizontal bridge that causes the programmable horizontal bridge to change from being conductive to being non-conductive, such that the specific circuit function is activated. In other embodiments, a third current pattern is delivered to the programmable horizontal bridge that causes the programmable horizontal bridge to change from being non-conductive to being conductive, such that the specific circuit function is deactivated. A fourth current pattern can be delivered to the programmable horizontal bridge that causes the programmable horizontal bridge to change from being non-conductive to being conductive, such that the specific circuit function is activated.

Accordingly, adding a programmable horizontal bridge between particular conductive lines provide increased device functionality by being able to indefinitely turn on or off specific device function based on whether the programmable horizontal bridge is caused to be a conductor or a non-conductor.

Figure 16:
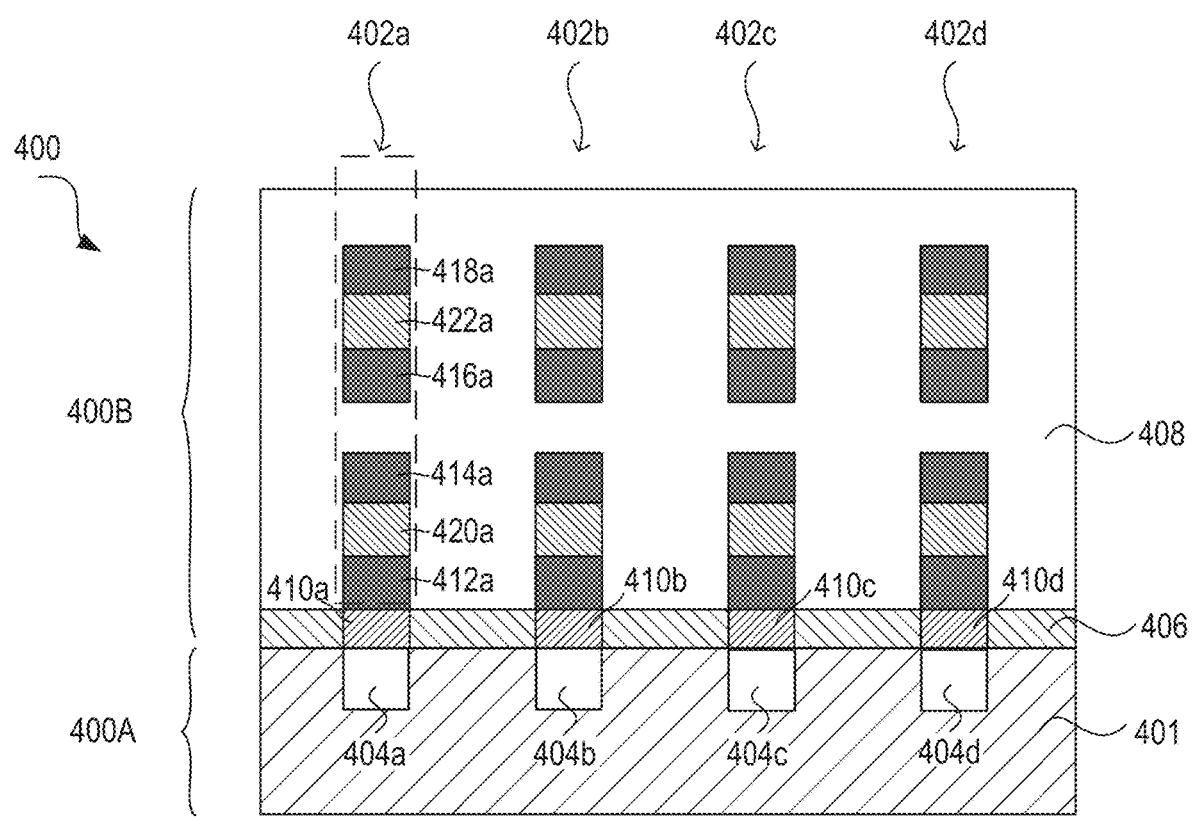
FIG. 16 is a cross-sectional view of a first exemplary wiring structure, in accordance with some embodiments.

FIG. 16 illustrates a cross-sectional view of a first exemplary wiring structure 400B in a semiconductor device 400 (also referred to as device 400), where the wiring structure 400B has a vertical configuration. As shown in FIG. 16, the semiconductor device 400 can include a substrate 401, and a device structure 400A can be formed based on the substrate 401. The device structure 400A can include a plurality of devices (not shown). The devices can include active devices and/or passive devices. For example, the devices can include resistors, capacitors, inductors, transformers, diodes, transistors, or other electronic structures. The devices in the device structure 400A can be connected to each other to form electronic circuits of various functions. For example, the electronic circuits can include memory circuits and/or logic circuits. Accordingly, the device structure 400A can include memory devices and/or logic devices that can be NAND memory devices, DRAM memory devices, central processing unit (CPU) devices, graphics processing unit (GPU) devices, or the like.

The device structure 400A can have a plurality of contact structures 404a-404d. The contact structures 404 can be source electrodes, drain electrodes, gate electrodes, word line contacts, or other contact structures that are coupled to the devices in the device structure 400A. In some embodiments, the contact structures 404 can include tungsten, Ti, TiN, Ta, TaN, or other suitable conductive materials.

In the semiconductor device 400, the wiring structure 400B is positioned over the device structure 400A and coupled to the device structure 400A through a plurality of first metal (or M1) layers 410a-410d, where the M1 layers 410 is positioned over and coupled to the contact structures 404. For example, the M1 410a is positioned over and connected to the contact structure 404a. The M1 layers 410 can be formed in a first dielectric layer 406, where the first dielectric layer 406 is positioned over the substrate 401.

Still referring to FIG. 16, the wiring structure 400B can have the vertical configuration in that a plurality of wiring stacks 402a-402d are formed over the M1 layers 410. The wiring stacks 402 can include conductive connection segments 412-418 and programmable connection segments 420-422 that are stacked over the M1 layers 410 along a vertical direction (e.g., Z direction) perpendicular to the substrate 401. The wiring stacks 402 can be formed in a second dielectric layer 408 and connected to the M1 layers 410. For example, the wiring stack 402a is positioned over and connected to the M1 layer 410a.

In one embodiment, the conductive connection segments 412-418 can be conductive lines, and the programmable connection segments 420-422 can be programmable lines. Thus the programmable lines 420-422 are positioned between the conductive lines 412-418 so as to connect the conductive lines 412-418 to one another. For example, the programmable line 420a is positioned between the conductive line 412a and 414a so as to connect the conductive line 412a and the conductive line 414 from one another. In another embodiment, the conductive connection segments 412-418 can be conductive vertical interconnects with a circular pillar-shape, and the programmable connection segments 420-422 can be programmable vertical interconnects with a circular pillar-shape to connect the conductive vertical interconnects to one another. In yet another embodiment, the conductive connection segments 412-418 can be conductive lines and the programmable connection segments 420-422 can be programmable vertical interconnects, where the conductive lines 412-418 are coupled to each other based on the programmable vertical interconnects 420-422. In some embodiments, the connective connection segments and the programmable connection segments in each of wiring stacks 402 can be coupled to each other to form a connection channel. For example, the conductive connection segment 414a and the conductive connection segment 416a can be coupled to one another through a conductive vertical interconnect or a programmable vertical interconnect. Accordingly, a connection channel can be formed in the wiring stack 402a.

The programmable connection segments 420-422 can include the programmable material as mentioned above. The programmable material can be the phase changeable material having the modifiable resistivity in that the programmable connection segments 420-422 can switch between being conductive and being non-conductive responsive to a current pattern delivered to the programmable connection segments 420-422. Thus the wiring structure 400B with the vertical configuration can provide vertical programmable switches based on the conductive connection segments 412-418 and the programmable connection segments 420-422. The vertical programmable switches can be obtained in the device 400 by switching the programmable connection segments 420-422 between being conductive and being non-conductive. For example, when the programmable connection segments 420a and 422a are conductive in response to the current pattern, the wiring stack 402a accordingly becomes conductive, and input/output signals are transmittable to/from the device structure 400A through a connection channel form in the wiring stack 402a. When the programmable connection segments 420a and 422a are non-conductive in response to the current pattern, the wiring stack 402a accordingly becomes non-conductive, and input/output signals are not transmittable to/from the device structure 400A.

In some embodiments, the first dielectric layer 406 can include $SiO_2$, TEOS, $SiH_4$ oxide, low-k dielectric materials, or other suitable dielectric materials. The M1 layers 410 and the conductive connection segments 412-418 can include copper, tungsten, ruthenium, cobalt, aluminum, or other suitable conductive materials. In some embodiments, the second dielectric layer 408 can include $SiO_2$, TEOS, $SiH_4$ oxide, low-k dielectric materials, or other suitable dielectric materials. In some embodiments, the second dielectric layer 408 can be a dielectric stack in which dielectric films are stacked over the first dielectric layer 406.

It should be noted that FIG. 16 is merely an example. The wring structure can include any number of M1 layers, any number of conductive connection segments, and any number of programmable connection segments according to the structure of the semiconductor device 400.

Figure 17:
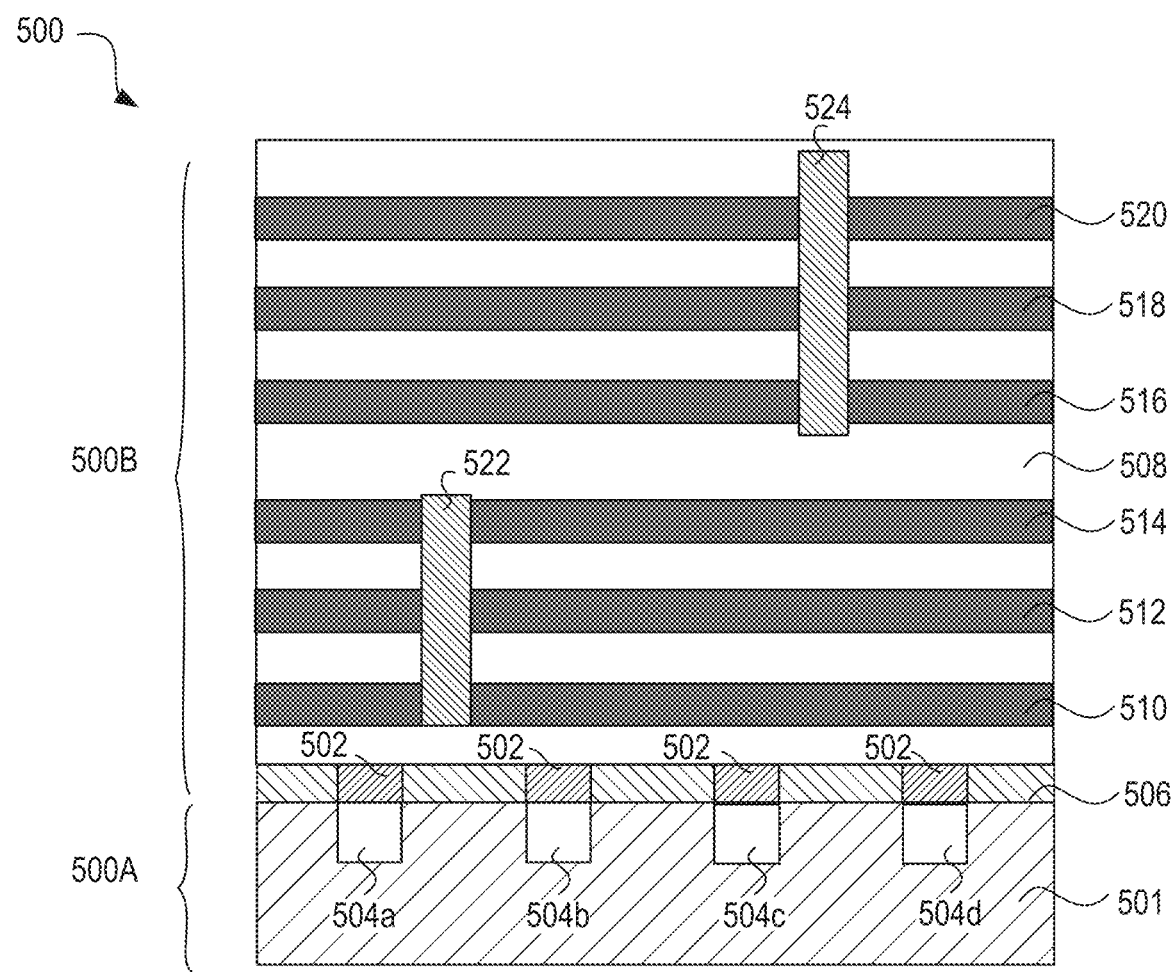
FIG. 17 is a cross-sectional view of a second exemplary wiring structure, in accordance with some embodiments.

FIG. 17 illustrates a cross-sectional view of a second exemplary wiring structure 500B in a semiconductor device 500 (or device 500), where the wiring structure 500B has a horizontal configuration. As shown in FIG. 17, the device 500 can include a substrate 501 where a device structure 500A can be formed based on the substrate 501. Similar to the device structure 400A, the device structure 500A can include a plurality of devices that include active devices and/or passive devices.

The device structure 500A can have a plurality of contact structures 504a-504d. The contact structures 504 can be source electrodes, drain electrodes, gate electrodes, word line contacts, or other contact structures that are coupled to the devices in the device structure 500A.

In the device 500, the wiring structure 500B is positioned over the device structure 500A and coupled to the device structure 500A through a plurality of first metal (or M1) layers 502, where the M1 layers 502 are positioned over and coupled to the contact structures 504. The M1 layers 502 can be formed in a first dielectric layer 506, where the first dielectric layer 506 is positioned over the substrate 501.

Still referring to FIG. 17, the wiring structure 500B can also include a plurality of conductive lines 510-520 stacked over the M1 layers 502 along a vertical direction (e.g., Z direction) perpendicular to the substrate 501. The conductive lines 510-520 can be formed in a second dielectric layer 508 and spaced apart from one another by the second dielectric layer 508. The wiring structure 500B can further have programmable connection segments 522-524 that extend through the conductive lines 510-520 so that the conductive lines 510-520 can be coupled to each other. For example, the programmable connection segment 522 extends through the conduction lines 510-514 to connect the conduction lines 510-514 to each other.

In some embodiments, the programmable connection segments 522-524 can be programmable lines that extend through the conductive lines and further extend along a direction perpendicular to the cross-sectional view (e.g., Y direction). In some embodiments, the programmable connection segments 522-524 can be programmable vertical interconnects with a circular pillar-shape. In some embodiments, the programmable connection segments 522-524 can include phase changeable material so that the programmable connection segments 522-524 can switch between being conductive and being non-conductive responsive to a current pattern delivered to the programmable connection segments 522-524. The wiring structure 500B with the horizontal configuration thus can provide horizontal programmable switches based on the conductive lines 510-510 and the programmable connection segments 522-524. For example, when the programmable connection segment 522 is conductive in response to a current pattern, the conduction lines 510-514 are connected to each other through the programmable connection segment 522. When the programmable connection segment 522 becomes non-conductive in response to the current pattern, the conduction lines 510-514 are disconnected to each other accordingly.

The conductive lines 510-514 and the conductive lines 516-520 can also be coupled to each other through one or more conductive vertical interconnects or programmable vertical interconnects. Further, the conductive lines 510-514 can be coupled to the M1 layers 502 through one or more conductive vertical interconnects or programmable vertical interconnects.

It should be noted that FIG. 17 is merely an example. The wring structure can include any number of M1 layers, any number of conductive lines, and any number of programmable connection segments according to the structure of the device 500. In addition, the first and second dielectric layers in the device 500 can have similar materials to the first and second dielectric layers in the device 400. The conductive lines in device 500 can include similar materials to the conductive connection segments in device 400.

Figure 18:
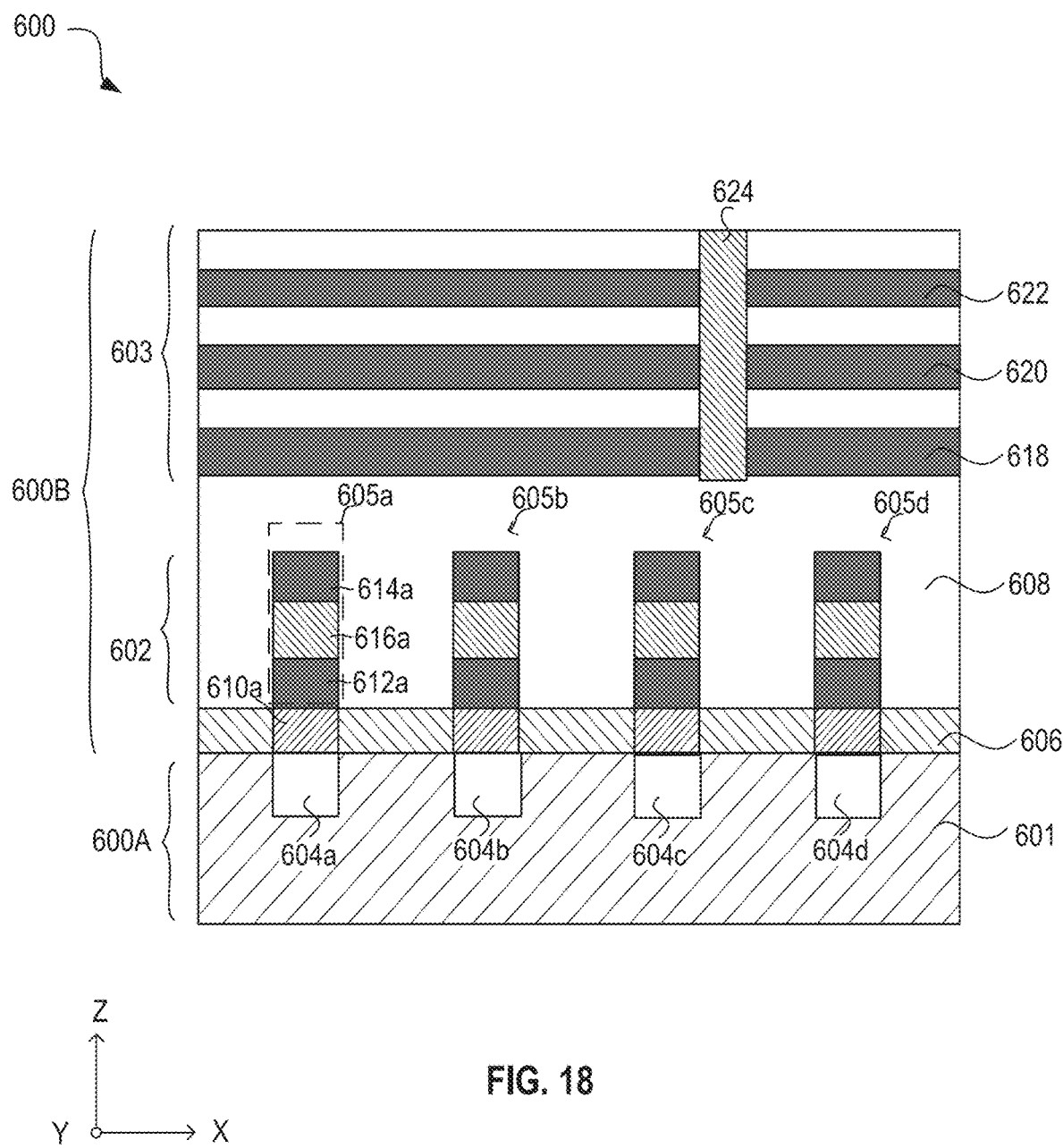
FIG. 18 is a cross-sectional view of a third exemplary wiring structure, in accordance with some embodiments.

FIG. 18 is a cross-sectional view of a third exemplary wiring structure 600B in a semiconductor device 600 (or device 600). As shown in FIG. 18, the wiring structure 600B is positioned over a device structure 600A of the device 600. The device structure 600A is formed based on a substrate 601. The wiring structure 600B can have a vertical wiring structure 602 with the vertical configuration and a horizontal wiring structure 603 with the horizontal configuration. The vertical wiring structure 602 is positioned over M1 layers 610 that are arranged in a first dielectric layer 606, and the horizontal wiring structure 603 is positioned over the vertical wiring structure 602. The wiring structure 600B is coupled to the device structure 600A through the M1 layers 610 that are positioned over and coupled to contact structures 604 of the device structure 600A.

The vertical wiring structure 602 can have a plurality of wiring stacks 605a-605d that are positioned over the M1 layers 610 and couple to the M1 layers 610. Each of the wiring stacks 605 can have conductive connection segments and programmable connection segments that are stacked over the M1 layers 610 to form vertical programmable switches. The programmable connection segments can be positioned between the conductive connection segments so that the conductive connection segments can be coupled/de-coupled to each other based on the programmable connection segments. For example, the wiring stack 605a can have conductive connection segments 612a-614a and a programmable connection segment 616a. The programmable connection segment 616a is positioned between the conductive connection segments 612a-614a and the conductive connection segments 612a-614a can be coupled/de-coupled to each other in response to a phase condition (e.g., conductive or non-conductive) of the programmable connection segment 616a.

In some embodiments, the conductive connection segments (e.g., 612a-614a) can be conductive lines, and the programmable connection segments (e.g., 616a) can be programmable lines. In some embodiments, the conductive connection segments (e.g., 612a-614a) can be conductive vertical interconnects with a circular pillar-shape, and the programmable connection segments (e.g., 616a) can be programmable vertical interconnects with a circular pillar-shape. In some embodiments, the conductive connection segments (e.g., 612a-614a) can be conductive lines and the programmable connection segments (e.g., 616a) can be programmable vertical interconnects.

The horizontal wiring structure 603 can have conductive lines and programmable connection segments, where the programmable connection segments can extend through the conductive lines to form the horizontal programmable switches. As shown in FIG. 18, the horizontal wiring structure 603 includes conductive lines 618-622 that are stacked over the vertical wiring structure 602 and spaced apart from one another through a second dielectric layer 608. A programmable connection segment 624 extends through the conductive lines 618-622 so that the conductive lines 618-622 can be coupled/de-coupled to each other based on the programmable connection segment 624. The programmable connection segment 624 can be a programmable vertical interconnect or a programmable lines according to the structures of the device 600. The horizontal wiring structure 603 can be coupled to the vertical wiring structure 602 through one or more conductive vertical interconnects or programmable vertical interconnects.

Figure 19:
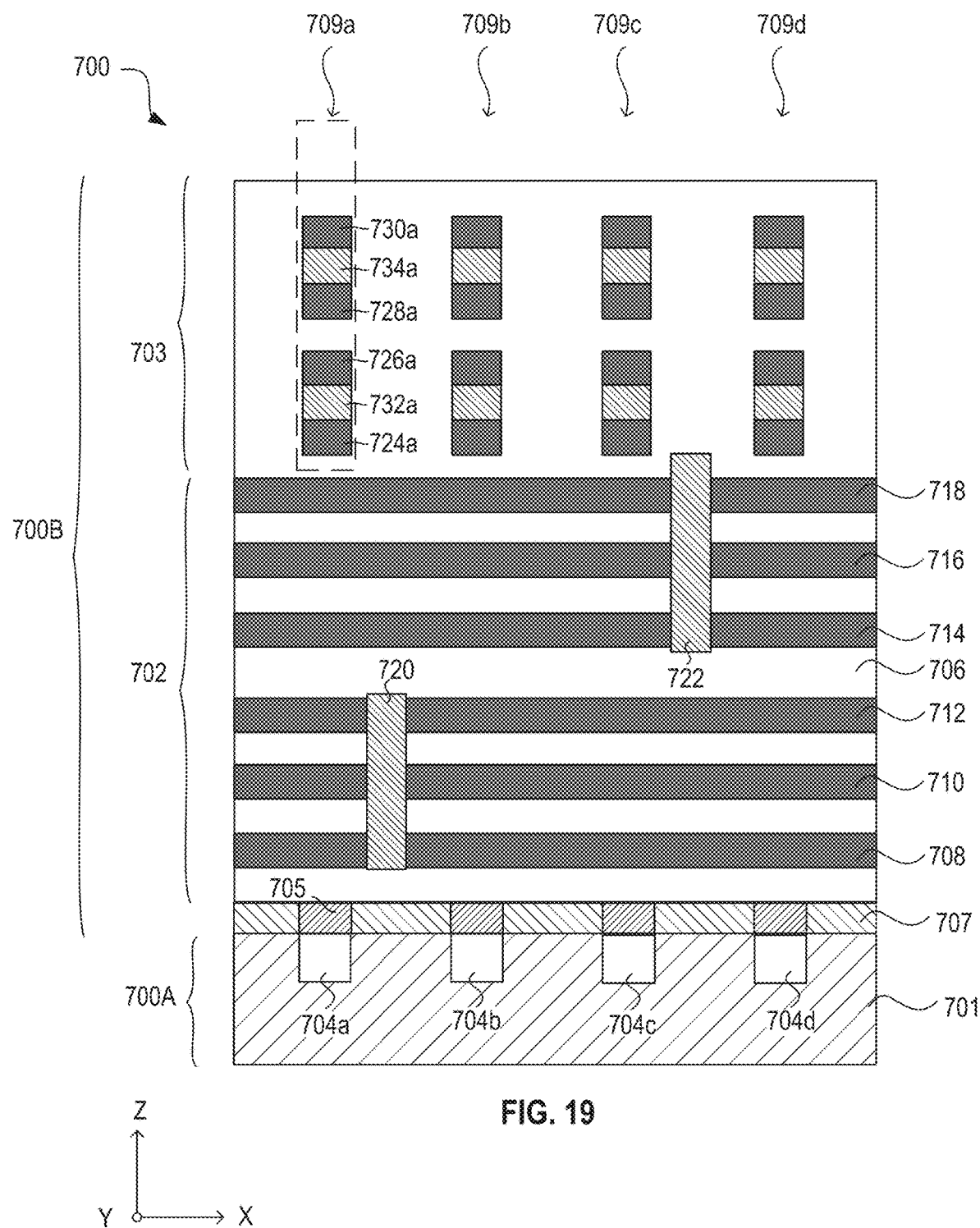
FIG. 19 is a cross-sectional view of a fourth exemplary wiring structure, in accordance with some embodiments.

FIG. 19 is a cross-sectional view of a fourth exemplary wiring structure 700B in a semiconductor device 700. As shown in FIG. 19, the wiring structure 700B is positioned over a device structure 700A of semiconductor device 700. The device structure 700A is formed based on a substrate 701. The wiring structure 700B can have a horizontal wiring structure 702 with the horizontal configuration and a vertical wiring structure 703 with the vertical configuration. The horizontal wiring structure 702 is positioned over M1 layers 705 that are arranged in a first dielectric layer 707, and the vertical wiring structure 703 is positioned over the horizontal wiring structure 702. The wiring structure 700B is coupled to the device structure 700A through the M1 layers 705 that are positioned over and coupled to contact structures 704 of the device structure 700A.

The horizontal wiring structure 702 can have conductive lines and programmable connection segments, where the programmable connection segments can extend through the conductive lines to form the horizontal programmable switches. As shown in FIG. 19, the horizontal wiring structure 702 includes conductive lines 708-718 that are stacked over the M1 layers 705, and spaced apart from one another by a second dielectric layer 706. A programmable connection segment 720 extends through the conductive lines 708-712 so that the conductive lines 708-712 can be coupled/de-coupled to each other based on a phase condition of the programmable connection segment 720. Similarly, a second programmable connection segment 722 extends through the conductive lines 714-718 so that the conductive lines 714-718 can be coupled/de-coupled to each other based on a phase condition of the programmable connection segment 722. The programmable connection segments 720-722 can be programmable vertical interconnects or programmable lines according to the structures of the device 700. The conductive lines 708-712 and the conductive lines 714-718 can also be coupled to each other through one or more conductive vertical interconnects or programmable vertical interconnects. Further, the conductive lines 708-712 can be coupled to the M1 layers 705 through one or more conductive vertical interconnects or programmable vertical interconnects.

The vertical wiring structure 703 can have a plurality of wiring stacks 709a-709d that are positioned over the horizontal wiring structure 702 and coupled to the horizontal wiring structure 702. Each of the wiring stacks 709 can have conductive connection segments and programmable connection segments that are stacked over the horizontal wiring structure 702 to form vertical programmable switches. The programmable connection segments can be positioned between the conductive connection segments so that the conductive connection segments can be coupled/de-coupled to each other based on the programmable connection segments. For example, the wiring stack 709a can have conductive connection segments 724a-730a and programmable connection segments 732a-734a. The programmable connection segment 732a is positioned between the conductive connection segments 724a-726a so that the conductive connection segments 724a-726a can be coupled/de-coupled to each other according to a phase condition (e.g., conductive or non-conductive) of the programmable connection segment 732a. Similarly, the programmable connection segment 734a is positioned between the conductive connection segments 728a-730a and the conductive connection segments 728a-730a can be coupled/de-coupled to each other based on the programmable connection segment 734a.

Still referring to FIG. 19, the conductive connection segment 728a and the conductive connection segment 726a can be coupled to one another through a conductive vertical interconnect or a programmable vertical interconnect. The conductive connection segment 724a can also be coupled to the conductive line 718 through one or more conductive vertical interconnects or programmable vertical interconnects.

In some embodiments, the conductive connection segments (e.g., 724a-730a) can be conductive lines, and the programmable connection segments (e.g., 732a-734a) can be programmable lines. In some embodiments, the conductive connection segments (e.g., 724a-730a) can be conductive vertical interconnects with a circular pillar-shape, and the programmable connection segments (e.g., 732a-734a) can be programmable vertical interconnects with a circular pillar-shape. In some embodiments, the conductive connection segments (e.g., 724a-730a) can be conductive lines and the programmable connection segments (e.g., 732a-734a) can be programmable vertical interconnects.

Figure 20:
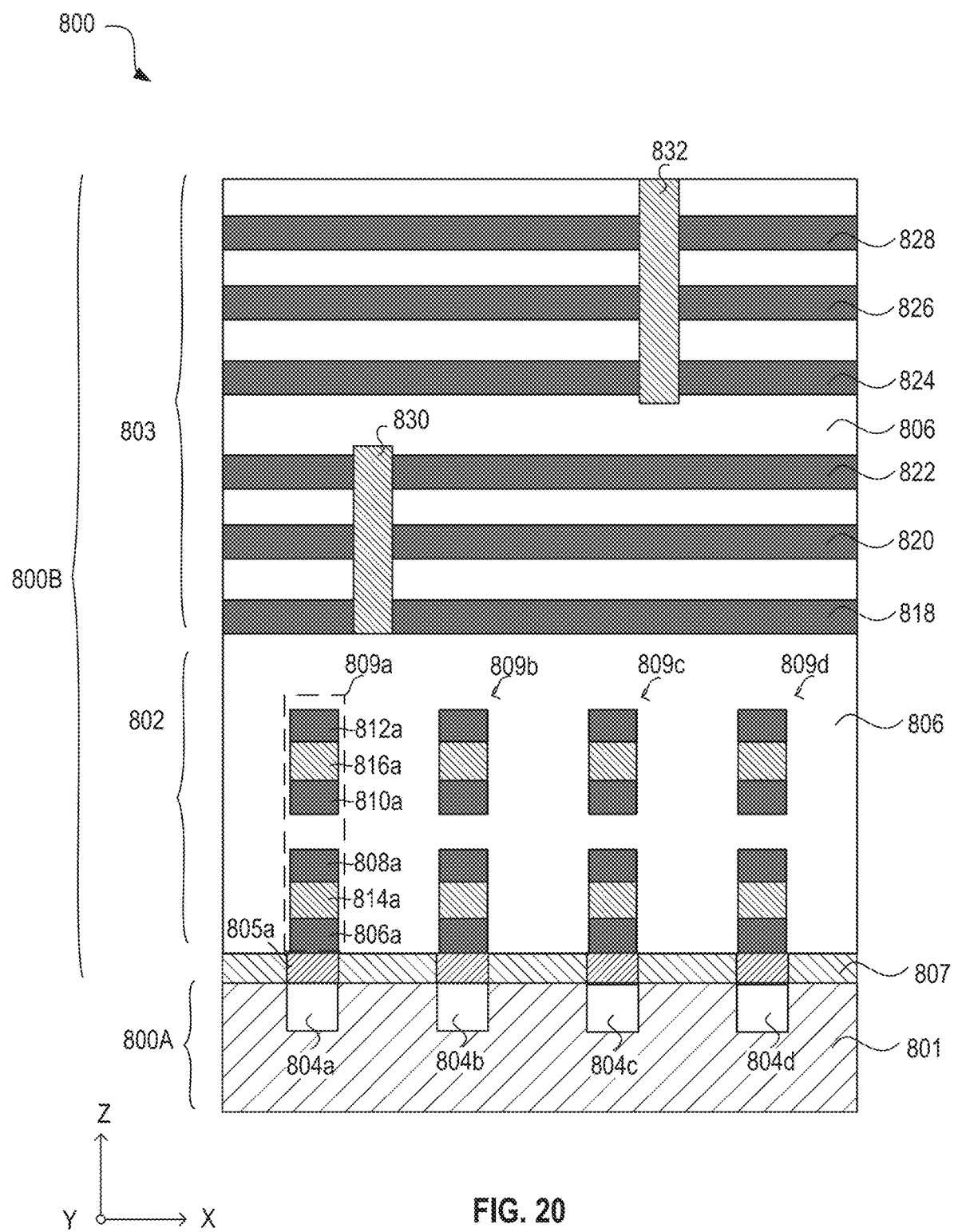
FIG. 20 is a cross-sectional view of a wiring structure positioned over a device structure, in accordance with some embodiments.

FIG. 20 is a cross-sectional view of a wiring structure 800B positioned over a device structure 800A in a semiconductor device 800. The semiconductor device 800 can have the device structure 800A formed based on a substrate 801. The device structure 800A can include 3D logic devices (e.g., 3D complementary field-effect transistor (C-FET) devices), 3D NAND devices, or other electronic devices. The device structure 800A can have contact structures 804.

The wiring structure 800B can be coupled to the device structure 800A through M1 layers 805 that are formed in a first dielectric layer 807 and coupled to the contact structures 804. The wiring structure 800B can include a vertical wiring structure 802 providing vertical programmable switches and a horizontal wiring structure 803 providing horizontal programmable switches. The horizontal wiring structure 803 is positioned over and coupled to the vertical wiring structure 802. The vertical wiring structure 802 is further coupled to the M1 layers 805.

The vertical wiring structure 802 can include wiring stacks 809-809d. Each of the wiring stacks 809 can include conductive connection segments and programmable connection segments that are stacked over the M1 layers 805. For example, the wiring stack 809a can include conductive connection segments 806a-812a and programmable connection segments 814a-816a. The programmable connection segment 814a is positioned between the conductive connection segments 806a-808a.

The horizontal wiring structure 803 can include conductive lines 818-828 and programmable connection segments 830-832. The programmable connection segments can extend through the conductive lines so that the conductive lines can be coupled/de-coupled to each other. For example, the programmable connection segment 830 extends through the conductive lines 818-822 and connects the conductive lines 818-822 to each other. Accordingly, the conductive lines 818-822 can be coupled/de-coupled to each other based on a phase condition of the programmable connection segment 830. The programmable connection segments 830-832 can be programmable lines or programmable vertical interconnects.

Figure 21:
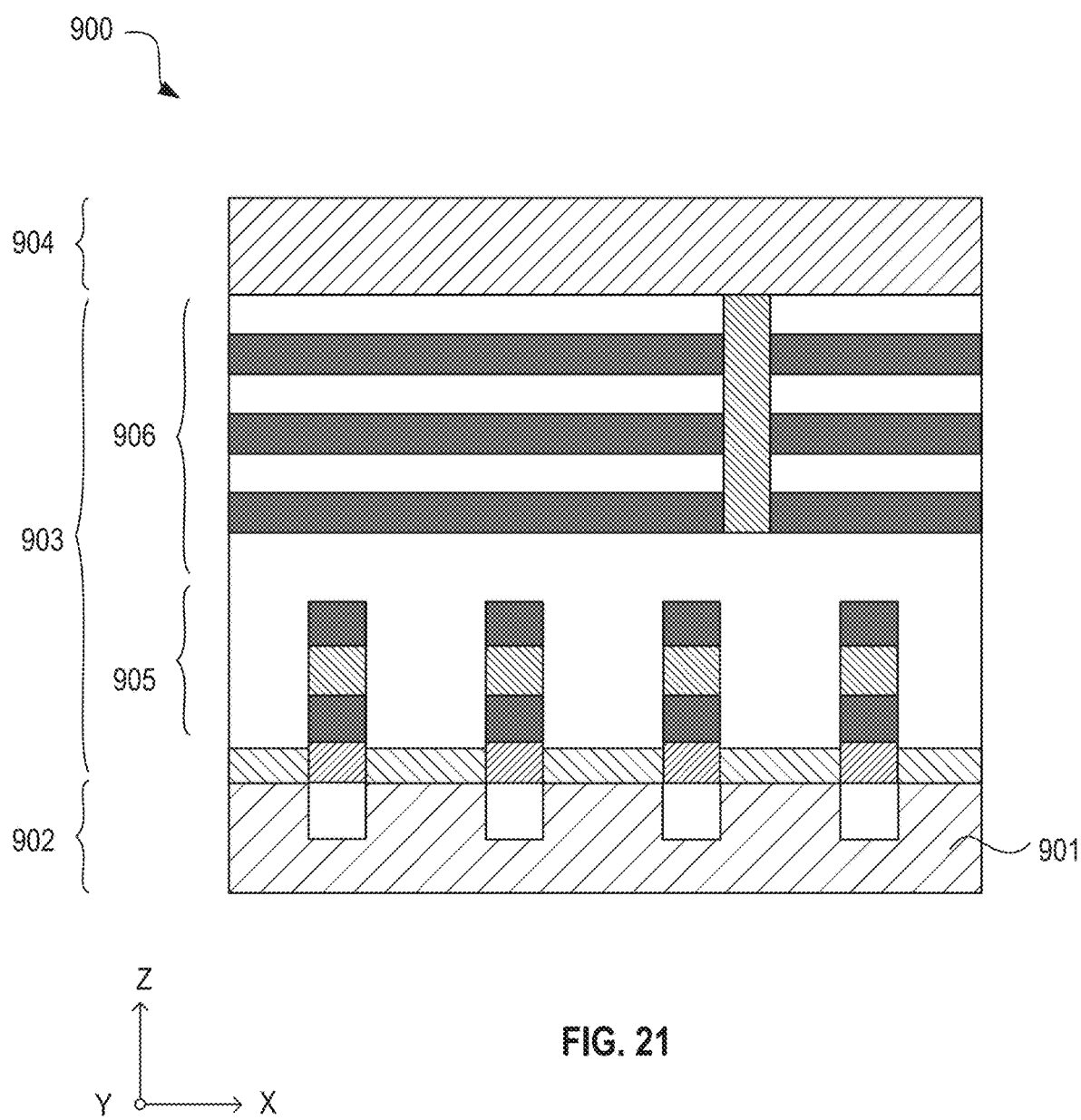
FIG. 21 is a cross-sectional view of a wiring structure positioned under a device structure, in accordance with some embodiments.

FIG. 21 is a cross-sectional view of a wiring structure 903 positioned under a first device structure 904 in a semiconductor device 900. The semiconductor device 900 can further have a second device structure 902 formed based on a substrate 901. As shown in FIG. 21, the wiring structure 903 can further be disposed between the first device structure 904 and the second device structure 902. The wring structure 903 can include vertical wiring structure 905 and horizontal wiring structure 906. The vertical wiring structure 905 is positioned over and coupled to the second device structure 902. The horizontal wiring structure 906 is positioned over and coupled to the vertical wiring structure 905. The horizontal wiring structure 906 is further positioned under and coupled to the first device structure 904. In one embodiment, the semiconductor device 900 can be a 3D NAND device. The first device structure 904 can be an array region of the 3D NAND device 900 and the second device structure 902 can be a periphery region of the 3D NAND device 900. The array region 904 is thus coupled to and operated by the periphery region 902 through the wiring structure 903. In another embodiment, the first device structure 904 can be first logic device and the second device structure 902 can be a second device. The first logic device 904 is thus coupled to the second logic device 902 through the wiring structure 903. In another embodiment, the second device structure 902 can be implanted structures (e.g., N-type well, or P-type well) or buried power rail structures. The implanted structure provides electrical isolation and the buried power rail structure can provide power supplies to the first device structure 904. In yet another embodiment, the semiconductor device 900 is processed with a packaging technology (e.g., flip chip technology). Thus the second device structure 902 can be interconnects formed in the substrate 901, where the substrate 901 can be an organic substrate (e.g., epoxy). The first device structure 904 is thus bonded to the substrate 901 and coupled to the second device structure 902 through the wiring structure 903.

Figure 22:
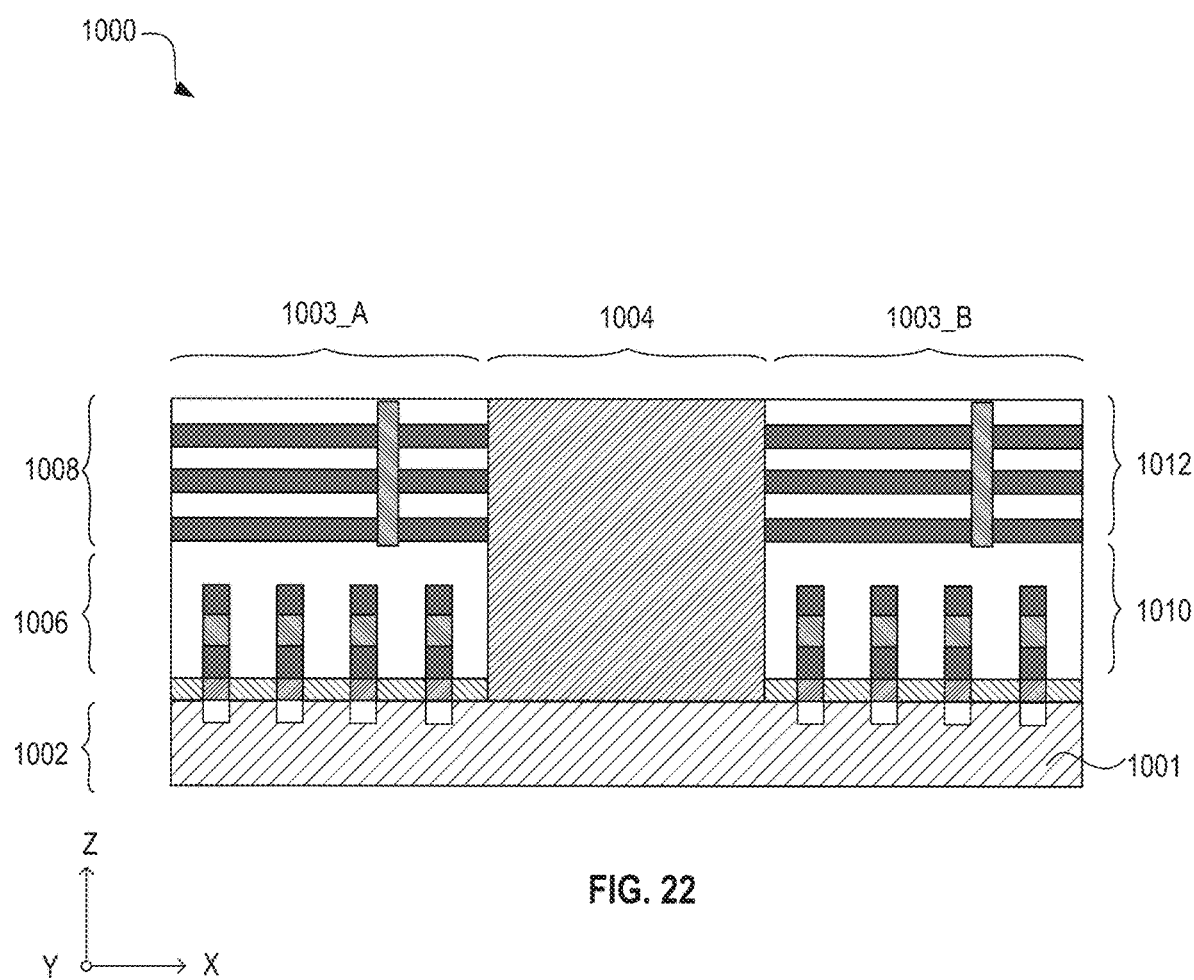
FIG. 22 is a cross-sectional view of a wiring structure and a device structure positioned side by side, in accordance with some embodiments.

FIG. 22 is a cross-sectional view of a wiring structure 1003 and a first device structure 1004 that are positioned side by side over a substrate 1001 in a semiconductor device 1000. The semiconductor device 1000 can include a second device structure 1002 that is formed in the substrate 1001. In some embodiments, the second device structure 1002 can be implanted structures, such as P-well structures and N-well structures configured to provide electrical isolations. The second device structure 1002 can also be buried power rail structures configured to provide power supplies to the first device structure 1004. Over the substrate 1001, the first device structure 1004 and the wiring structure 1003 are positioned side by side. In some embodiments, the first device structure 1004 can be a 3D NAND device or a 3D C-FET device. The wiring structure 1003 can include a first wiring structure 1003_A and a second wiring structure 1003_B. The device structure 1004 is arranged between the first wiring structure 1003_A and the second wiring structure 1003_B. The first device structure 1004 can further be coupled to the second device structure 1002.

The first wiring structure 1003_A can include a vertical wiring structure 1006 that is coupled to the second device structure 1002 and configured to provide vertical programmable switches, and a horizontal wiring structure 1008 that is positioned over and coupled to the vertical wiring structure 1006, and configured to provide horizontal programmable switches. The first wiring structure 1003_A can further be coupled to the first device structure 1004 through the horizontal wiring structure 1008. The second wiring structure 1003_B can include a vertical wiring structure 1010 that is coupled to the second device structure 1002, and a horizontal wiring structure 1012 that is positioned over and coupled to the vertical wiring structure 1010. The wiring structure 1003_B can further be coupled to the first device structure 1004 through the horizontal wiring structure 1012. The vertical wiring structure 1010 can provide vertical programmable switches and the horizontal wiring structure 1012 can provide horizontal programmable switches.

Figure 23:
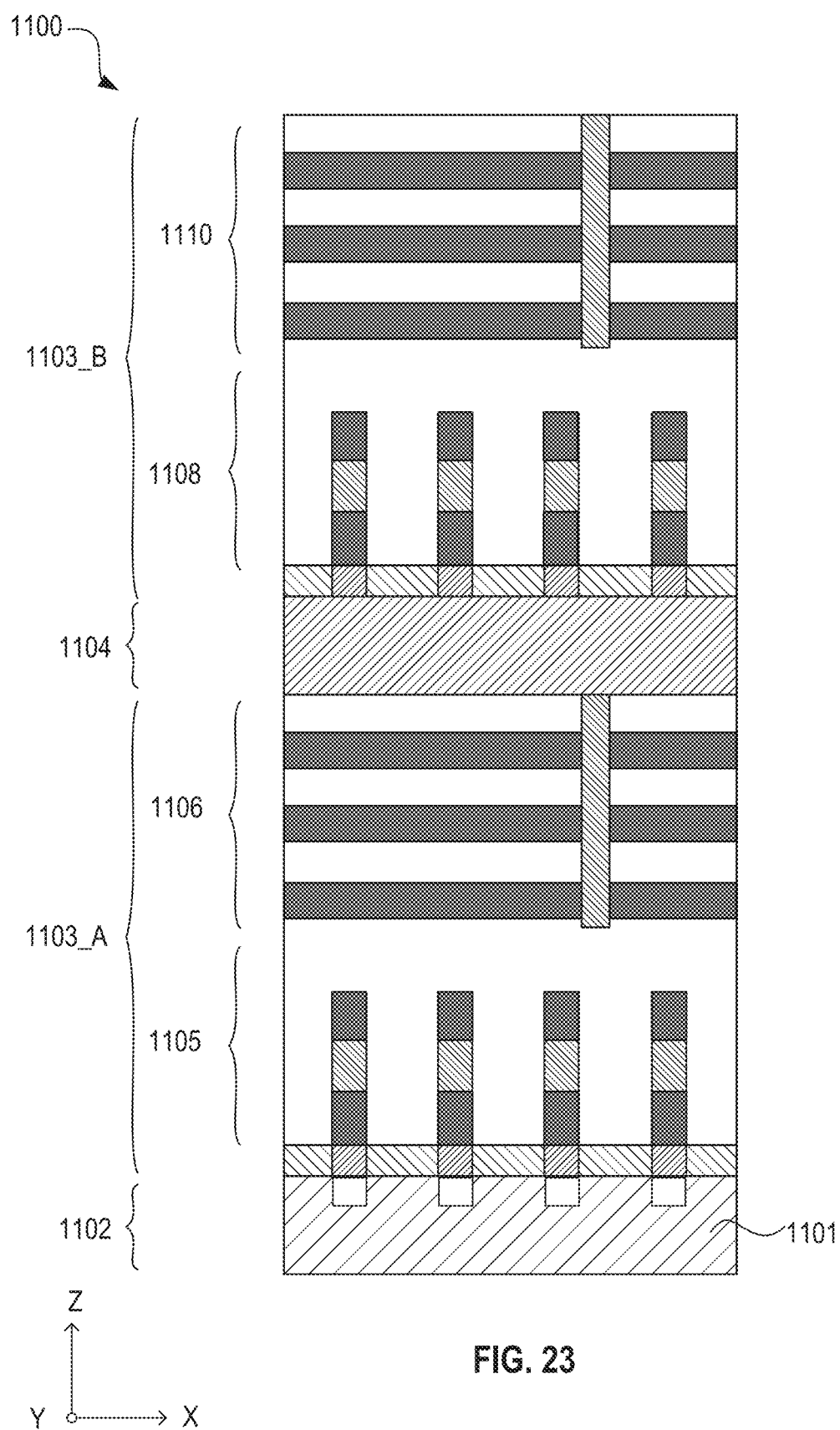
FIG. 23 is a cross-sectional view of a device structure positioned within a wiring structure, in accordance with some embodiments.

FIG. 23 is a cross-sectional view of a first device structure 1104 and a wiring structure 1103 that are stacked over a substrate 1101 in a semiconductor device 1100. The semiconductor device 1100 can include a second device structure 1102 that is formed in the substrate 1101. In some embodiments, the second device structure 1102 can include implanted structures, such as P-well structures and N-well structures configured to provide electrical isolations. The second device structure 1102 can also include buried power rail structures configured to provide power supplies to the first device structure 1104. Over the substrate 1101, the first device structure 1104 and the wiring structure 1103 are disposed in stack. In some embodiments, the first device structure 1104 can be a 3D NAND device or a 3D C-FET device. The wiring structure 1103 can include a first wiring structure 1103_A and a second wiring structure 1103_B. The first device structure 1104 is further arranged between the first wiring structure 1103_A and the second wiring structure 1103_B. The first wiring structure 1103_A is positioned over and coupled to the second device structure 1102. The first device structure 1104 is positioned over and coupled to the first wiring structure 1103_A. The second wiring structure 1103_B is positioned over and coupled to the first device structure 1104.

Still referring to FIG. 23, the first wiring structure 1103_A can include a vertical wiring structure 1105 and a horizontal wiring structure 1106. In an embodiment of FIG. 23, the vertical wiring structure 1105 can be positioned over and coupled to the second device structure 1102, and the horizontal wiring structure 1106 can be positioned over and coupled to the vertical wiring structure 1105. The horizontal wiring structure 1106 can further be coupled to the first device structure 1104. The vertical wiring structure 1105 can provide vertical programmable switches and the horizontal wiring structure 1106 can provide horizontal programmable switches. The second wiring structure 1103_B can include a vertical wiring structure 1108 and a horizontal wiring structure 1110. In an embodiment of FIG. 23, the vertical wiring structure 1108 can be positioned over and coupled to the first device structure 1104, and the horizontal wiring structure 1110 can be positioned over and coupled to the vertical wiring structure 1108. The vertical wiring structure 1108 can provide vertical programmable switches and the horizontal wiring structure 1110 can provide horizontal programmable switches.

According to aspects of the disclosure illustrated in FIGS. 16-23, multiple stacks of 3D devices and 3D connections can be implemented with universal programmable connection elements (e.g., the vertical wiring structure and the horizontal wiring structure) in both horizontal and vertical dimensions. Thus an increased 3D circuit density can be achieved since all connections can have a programmable feature option based on the universal programmable connection elements.

In some embodiments, each plane/layer of the devices (e.g., the device structure 1004) can contain and/or be connected to the universal programmable connection elements.

In the disclosure, based on the universal programmable connection elements (e.g., the vertical wiring structure and the horizontal wiring structure), 3D metal liens to metal lines along a horizontal plane can be programmable. 3D metal lines to metal lines along a vertical plane can be programmable. 3D metal lines to metal lines along one or more vertical plane combined with one or more horizontal planes can be programmable. 3D metal lines to any circuit device element lines along a horizontal plane can be programmable. 3D metal line to any circuit device element lines along a vertical plane can be programmable. 3D metal line to any circuit device element lines along one or more vertical plane combined with one or more horizontal planes can be programmable.

The various embodiments described herein offer several advantages over related wiring structures. For example, the universal programmable connection elements allow new universal circuit designs since any circuit element can have intelligent design of programmable feature. The universal programmable connection elements of the disclosure are compatible with all 3D memory types (e.g., 3D NAND, 3D DRAM) and 3D logic structures (e.g., 3D C-FET). The universal programmable connection elements can be utilized for any metal routing line (either to program line) or to program a connection to a device element. The universal programmable connection elements enable 3D speed enhancement since metal routing can be tuned for optimum circuit operation. The universal programmable connection elements can further optimize the layout of I/O pads into a 3D structure due to programmable features. The universal programmable connection elements can also be utilized to route an extensive dense 3D wiring grid of wiring between adjacent 3D transistor planes with minimum layout features.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
a device structure positioned over a substrate, the device structure including devices; and
a wiring structure positioned over the substrate and coupled to at least one of the devices, the wiring structure including conductive lines and programmable lines, the conductive lines extending along planes in parallel with a top surface of the substrate, the programmable lines each including a programmable material having a modifiable resistivity in that the programmable lines each change between being conductive and being non-conductive responsive to a current pattern delivered to the respective programmable line, wherein:
a first programmable line of the programmable lines is positioned between two first conductive lines of the conductive lines, the first programmable line and the two first conductive lines being disposed side by side within the same one of the planes in parallel with the top surface of the substrate,
a second programmable line of the programmable lines is positioned between two second conductive lines of the conductive lines, the second programmable line and the two second conductive lines being stacked along a vertical direction; and
a third programmable line of the programmable lines extends through two or more third conductive lines of the conductive lines, the two or more third conductive lines being stacked along the vertical direction and spaced apart from one another by a dielectric layer in the vertical direction.

2. The semiconductor device of claim 1, further comprises:
metal layers over the device structure such that the wire structure is coupled to the device structure through the metal layers; and
conductive vertical interconnects extending along the vertical direction and being coupled to at least one of the conductive lines, at least one of the metal layers, and at least one of the programmable lines.

3. The semiconductor device of claim 2, wherein:
a programmable vertical interconnect of the programmable lines is positioned between a contact structure of a device of the devices and a conductive line of the conductive lines along the vertical direction.

4. The semiconductor device of claim 1, wherein the devices comprise at least one of an active device and a passive device.

5. The semiconductor device of claim 1, wherein the devices comprise at least one of a transistor, a diode, a memory device, a capacitor, and an inductor.

6. The semiconductor device of claim 1, wherein the wiring structure is positioned over the device structure, the wiring structure being coupled to the device structure through at least one of the programmable lines.

7. The semiconductor device of claim 1, wherein the wiring structure is positioned under the device structure, the wiring structure being coupled to the device structure through at least one of the programmable lines.

8. The semiconductor device of claim 1, wherein the wiring structure and the device structure are positioned side by side over the substrate, the wiring structure being coupled to the device structure through at least one programmable line of the programmable lines.

9. The semiconductor device of claim 1, wherein the wiring structure comprises a first wiring structure and a second wiring structure, the first wiring structure, the device structure and the second wiring structure being stacked sequential over the substrate, the first wiring structure, the device structure and the second wiring structure being coupled to each other through one or more programmable lines of the programmable lines.

10. The semiconductor device of claim 1, wherein the programmable material is a phase-changeable material that changes between being conductive and being non-conductive responsive to the current pattern.

11. A semiconductor device, comprising:
a device structure positioned over a substrate, the device structure including devices; and
a wiring structure positioned over the substrate and coupled to at least one of the devices, the wiring structure including metal layers positioned over and coupled to the device structure, conductive lines extending along planes in parallel with a top surface of the substrate, and programmable lines, the programmable lines each including a programmable material having a modifiable resistivity in that the programmable lines each change between being conductive and being non-conductive responsive to a current pattern delivered to the respective programmable line, wherein:

a first programmable line of the programmable lines is positioned between two first conductive lines of the conductive lines, the first programmable line and the two first conductive lines being disposed side by side within the same one of the planes in parallel with the top surface of the substrate, a second programmable line of the programmable lines is positioned between two second conductive lines of the conductive lines, the second programmable line and the two second conductive lines being stacked along a vertical direction; and a third programmable line of the programmable lines extends through two or more third conductive lines of the conductive lines, the two or more third conductive lines being stacked along the vertical direction and spaced apart from one another by a dielectric layer in the vertical direction.

12. The semiconductor device of claim 11, wherein:

a programmable vertical interconnect of the programmable lines is positioned between a contact structure of a device of the devices and a conductive line of the conductive lines along the vertical direction.

13. The semiconductor device of claim 11, wherein the devices comprise at least one of an active device and a passive device.

14. The semiconductor device of claim 11, wherein the devices comprise at least one of a transistor, a diode, a memory device, a capacitor, and an inductor.

15. The semiconductor device of claim 11, wherein the wiring structure is positioned over the device structure, the wiring structure being coupled to the device structure through at least one of the programmable lines.

16. The semiconductor device of claim 11, wherein the wiring structure is positioned under the device structure, the wiring structure being coupled to the device structure through at least one of the programmable lines.

17. The semiconductor device of claim 11, wherein the wiring structure and the device structure are positioned side by side over the substrate, the wiring structure being coupled to the device structure through at least one programmable line of the programmable lines.

18. The semiconductor device of claim 11, wherein the wiring structure comprises a first wiring structure and a second wiring structure, the first wiring structure, the device structure and the second wiring structure being stacked sequential over the substrate, the first wiring structure, the device structure and the second wiring structure being coupled to each other through one or more programmable lines of the programmable lines.

* * * * *